(12) United States Patent
Wu et al.

(10) Patent No.: US 10,388,867 B2
(45) Date of Patent: Aug. 20, 2019

(54) VARIABLE RESISTANCE MEMORY DEVICES

(71) Applicant: SAMSUNG ELECTRONICS CO., LTD., Suwon-si, Gyeonggi-do (KR)

(72) Inventors: Zhe Wu, Suwon-si (KR); Soon-Oh Park, Suwon-si (KR); Jeong-Hee Park, Hwaseong-si (KR); Dong-Ho Ahn, Hwaseong-si (KR); Hideki Horii, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 68 days.

(21) Appl. No.: 15/294,873

(22) Filed: Oct. 17, 2016

(65) Prior Publication Data

US 2017/0250222 A1 Aug. 31, 2017

(30) Foreign Application Priority Data

Feb. 25, 2016 (KR) .......................... 10-2016-0022507

(51) Int. Cl.
*H01L 47/00* (2006.01)
*H01L 45/00* (2006.01)
*H01L 27/24* (2006.01)

(52) U.S. Cl.
CPC ........ *H01L 45/144* (2013.01); *H01L 27/2409* (2013.01); *H01L 27/2427* (2013.01); *H01L 27/2463* (2013.01); *H01L 27/2481* (2013.01); *H01L 45/04* (2013.01); *H01L 45/06* (2013.01); *H01L 45/1233* (2013.01); *H01L 45/1253* (2013.01); *H01L 45/1675* (2013.01); *H01L 45/1683* (2013.01)

(58) Field of Classification Search
CPC ............. H01L 27/2409; H01L 27/2427; H01L 27/2463; H01L 27/2481; H01L 45/04; H01L 45/06; H01L 45/1233; H01L 45/1253; H01L 45/144; H01L 45/1675; H01L 45/1683
See application file for complete search history.

(56) References Cited

U.S. PATENT DOCUMENTS

| | | |
|---|---|---|
| 8,093,576 B1 | 1/2012 | Lee |
| 8,841,644 B2 | 9/2014 | Karpov et al. |
| 8,847,186 B2 | 9/2014 | Redaelli et al. |
| 2006/0039192 A1* | 2/2006 | Ha .................... H01L 45/1233 365/163 |
| 2009/0021977 A1* | 1/2009 | Kang ................. G11C 13/0004 365/163 |

(Continued)

FOREIGN PATENT DOCUMENTS

| | | |
|---|---|---|
| KR | 10-1436924 B1 | 9/2014 |
| KR | 10-2014-0125539 A | 10/2014 |

*Primary Examiner* — Robert G Bachner
(74) *Attorney, Agent, or Firm* — Lee & Morse, P.C.

(57) ABSTRACT

A variable resistance memory device including a selection pattern; an intermediate electrode contacting a first surface of the selection pattern; a variable resistance pattern on an opposite side of the intermediate electrode relative to the selection pattern; and a first electrode contacting a second surface of the selection pattern and including a n-type semiconductor material, the second surface of the selection pattern being opposite the first surface thereof.

16 Claims, 38 Drawing Sheets

(56) References Cited

U.S. PATENT DOCUMENTS

| | | | |
|---|---|---|---|
| 2009/0034319 A1* | 2/2009 | Ha | H01L 27/2409 365/148 |
| 2012/0012809 A1* | 1/2012 | Yang | H01L 27/101 257/4 |
| 2013/0207065 A1* | 8/2013 | Chiang | H01L 45/1253 257/2 |
| 2013/0320286 A1* | 12/2013 | Lee | H01L 45/145 257/2 |
| 2014/0034893 A1 | 2/2014 | Nakabayashi et al. | |
| 2014/0299833 A1 | 10/2014 | Cheong et al. | |
| 2014/0353569 A1* | 12/2014 | Lee | H01L 45/1683 257/4 |
| 2015/0034897 A1 | 2/2015 | Erbetta et al. | |
| 2015/0069630 A1* | 3/2015 | Sciarrillo | H01L 21/76895 257/776 |
| 2015/0084156 A1 | 3/2015 | Ravasio et al. | |
| 2015/0207066 A1 | 7/2015 | Ohba et al. | |

* cited by examiner

1ST DIRECTION
2ND DIRECTION

1ST DIRECTION
2ND DIRECTION

VARIABLE RESISTANCE MEMORY DEVICES

CROSS-REFERENCE TO RELATED APPLICATION

Korean Patent Application No. 10-2016-0022507, filed on Feb. 25, 2016, in the Korean Intellectual Property Office, and entitled: "Variable Resistance Memory Devices," is incorporated by reference herein in its entirety.

BACKGROUND

1. Field

Embodiments relate to a variable resistance memory device.

2. Description of the Related Art

Recently, memory devices having variable resistance characteristics have been developed. For example, phase-change random access memory (PRAM) devices, resistive random access memory (ReRAM) devices, magnetic random access memory (MRAM) devices have been developed.

In the above memory devices, memory cells including selection elements and variable resistance elements may be formed between lower and upper electrodes or between lower and upper conductive lines. When the memory cells are disposed in an array, the operation reliability of each memory cell may be enhanced.

SUMMARY

The embodiments may be realized by providing a variable resistance memory device including a selection pattern; an intermediate electrode contacting a first surface of the selection pattern; a variable resistance pattern on an opposite side of the intermediate electrode relative to the selection pattern; and a first electrode contacting a second surface of the selection pattern and including a n-type semiconductor material, the second surface of the selection pattern being opposite the first surface thereof.

The embodiments may be realized by providing a variable resistance memory device including a selection pattern including an ovonic threshold switch (OTS) material; an intermediate electrode contacting a first surface of the selection pattern; a variable resistance pattern on an opposite side of the intermediate electrode relative to the selection pattern; and a first electrode contacting a second surface of the selection pattern and including a conductive material having a work function of greater than about 4 eV, the second surface of the selection pattern being opposite the first surface thereof.

The embodiments may be realized by providing a variable resistance memory device including a substrate; first conductive lines adjacent to one another along a first direction on the substrate, each of the first conductive lines extending in a second direction that crosses the first direction, and the first and second directions being parallel to an upper surface of the substrate; second conductive lines adjacent to one another along the second direction and over the first conductive lines, each of the second conductive lines extending in the first direction; and a plurality of first memory cells between the first and second conductive lines, the first memory cells being in respective overlapping areas of the first and second conductive lines in a vertical direction substantially perpendicular to the upper surface of the substrate, and each of the first memory cells including a selection pattern including an ovonic threshold switch (OTS) material; an intermediate electrode contacting a first surface of the selection pattern; a variable resistance pattern opposite the selection pattern with respect to the intermediate electrode; and a first electrode contacting a second surface of the selection pattern and including an n-type semiconductor material or a conductive material having a work function more than about 4 eV, the second surface of the selection pattern being opposite the first surface thereof.

The embodiments may be realized by providing a variable resistance memory device including a substrate; first conductive lines adjacent to one another along a first direction on the substrate, each of the first conductive lines extending in a second direction crossing the first direction, and the first and second directions being parallel to an upper surface of the substrate; second conductive lines adjacent to one another along the second direction over the first conductive lines, each of the second conductive lines extending in the first direction; and a plurality of first memory cells between the first and second conductive lines, the memory cells being in respective overlapping areas of the first and second conductive lines in a vertical direction substantially perpendicular to the upper surface of the substrate, and each of the memory cells including a selection pattern including an ovonic threshold switch (OTS) material; an intermediate electrode contacting a first surface of the selection pattern; a variable resistance pattern on an opposite side of the intermediate electrode relative to the selection pattern; and a barrier pattern contacting a second surface of the selection pattern, the second surface of the selection pattern being opposite the first surface thereof, and the barrier pattern and the selection pattern forming a P-N junction or a Schottky barrier.

The embodiments may be realized by providing a variable resistance memory device including a selection pattern; a variable resistance pattern; an intermediate electrode between the selection pattern and the variable resistance pattern; an outer layer on the selection pattern such that the selection pattern is between the outer layer and the intermediate electrode, the outer layer contacting a surface of the selection pattern, wherein the variable resistance memory device includes a P-N junction or a Schottky barrier at an interface between the outer layer and the selection pattern.

BRIEF DESCRIPTION OF THE DRAWINGS

Features will be apparent to those of skill in the art by describing in detail exemplary embodiments with reference to the attached drawings in which:

FIGS. 40A and 40B to 46A and 46B illustrate cross-sectional views of stages in a method of manufacturing a variable resistance memory device, e.g., the variable resistance memory device shown in FIGS. 38 to 39, in accordance with example embodiments;

FIG. 49 to FIGS. 53A and 53B illustrate cross-sectional views of stages in a method of manufacturing a variable resistance memory device, e.g., the variable resistance memory device shown in FIGS. 47 and 48, in accordance with example embodiments;

DETAILED DESCRIPTION

Figure 1:
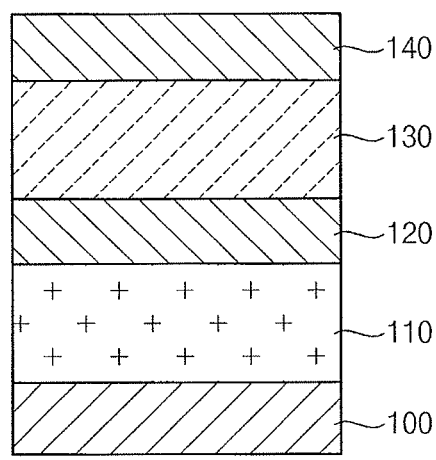
FIGS. 1 and 2 illustrate cross-sectional views of a variable resistance memory cell in accordance with example embodiments.
Figure 2:
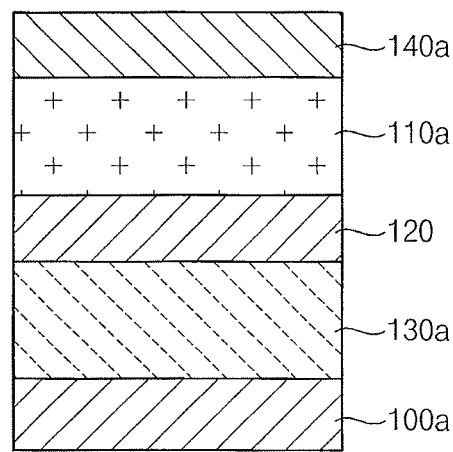

FIGS. 1 and 2 illustrate cross-sectional views of a variable resistance memory cell in accordance with example embodiments.

Referring to FIG. 1, the variable resistance memory cell may include, e.g., a sequentially stacked lower electrode 100, selection pattern 110, intermediate electrode 120, variable resistance pattern 130, and upper electrode 140. In an implementation, the upper electrode 140 may be omitted.

The lower electrode 100 may contact a lower surface of the selection pattern 110. For example, the lower electrode 100 may serve as a medium pattern for transferring currents to the selection pattern 110.

In an example embodiment, the lower electrode 100 may include an n-type semiconductor material. In an implementation, the lower electrode 100 may include silicon, germanium or silicon-germanium doped with n-type impurities, e.g., phosphorus, arsenic, etc. The lower electrode 100 may include a III-V semiconductor compound, e.g., InP, GaP, GaAs, GaSb, etc., doped with n-type impurities. As used herein, the term "or" is not an exclusive term, such that "A or B" would include A, B, or A and B.

In an example embodiment, the lower electrode 100 may include an n-type chalcogenide material. The n-type chalcogenide material may have an increasing n-type property as a content of germanium and/or silicon thereof increases. For example, the n-type chalcogenide material may have a content equal to or more than about 70 wt % of germanium and/or silicon.

In an example embodiment, the lower electrode 100 may include a conductive material having a work function equal to or greater than a target work function.

In an example embodiment, the target work function may be set as about 4 eV. For example, the target work function may be set as 4 eV, which is the work function of metallic titanium or titanium nitride used for a common electrode, and the lower electrode 100 may include a conductive material having a work function greater than the target work function.

For example, the lower electrode 100 may include metallic tungsten, tungsten nitride, metallic tantalum, or tantalum nitride, which may have a work function of about 4.8 eV.

In an example embodiment, the target work function may be set as about 5 eV. In this case, the lower electrode 100 may include amorphous carbon (about 5 eV work function), cobalt (about 5 eV work function), nickel (about 5.2 eV work function), or ruthenium (about 5.8 eV work function). These may be used alone or in a combination thereof.

In an example embodiment, the lower electrode 100 may include amorphous carbon or ruthenium.

In an example embodiment, the lower electrode 100 may include a conductive material doped with carbon so as to have an increased work function. In this case, the lower electrode 100 may include titanium carbonitride, titanium silicon carbonitride, etc.

The selection pattern 110 may contact an upper or inner surface of the lower electrode 100.

The selection pattern 110 may include a material having a changing resistance in an amorphous state between the lower electrode 100 and the intermediate electrode 120. For example, a relatively high resistance state, e.g., an off-state, and a relatively low resistance state, e.g., an on-state, may be reversibly repeated in the selection pattern 110.

In example embodiments, the selection pattern 110 may include an ovonic threshold switch (OTS) material. In an example embodiment, the selection pattern 110 may include arsenic, and may further include at least two of silicon, germanium, antimony, tellurium, selenium, indium, and tin. In an example embodiment, the selection pattern 110 may include selenium, and may further include at least two of arsenic, silicon, germanium, antimony, tellurium, indium, and tin.

In an example embodiment, the selection pattern 110 may include, e.g., AsTeGeSiIn, GeTe, SnTe, GeSe, SnSe, AsTeGeSiSbS, AsTeGeSiIP, AsTeGeSi, $As_2Te_3Ge$, $As_2Se_3Ge$, $As_{25}(Te_{90}Ge_{10})_{75}$, $Te_{40}As_{35}Si_{18}Ge_{6.75}In_{0.25}$, $Te_{28}As_{34.5}Ge_{15.5}S_{22}$, $Te_{39}As_{36}Si_{17}Ge_7P$, $As_{10}Te_{21}S_2Ge_{15}Se_{50}Sb_2$, $Si_5Te_{34}As_{28}Ge_{11}S_{21}Se_1$, AsTeGe-SiSeNS, AsTeGeSiP, AsSe, AsGeSe, AsTeGeSe, ZnTe, GeTePb, GeSeTe, AlAsTe, SeAsGeC, SeTeGeSi, GeSb-TeSe, GeBiTeSe, GeAsSbSe, GeAsBiTe, GeAsBiSe, $Ge_xSe_{1-x}$, etc. In an example embodiment, the selection pattern 110 may further include dopants, e.g., carbon, boron, oxygen, nitrogen, sulfur, or phosphorus.

The selection pattern 110 may have p-type semiconductor property. For example, the selection pattern 110 may have increasing p-type property as a content of, e.g., tellurium, selenium, arsenic, sulfur, etc., increases.

In example embodiments, when the lower electrode 100 includes the n-type semiconductor material, a P-N junction may be formed by the selection pattern 110 and the lower electrode 100.

In an example embodiment, when the lower electrode 100 includes a conductive material having a work function equal to or more than the target work function, e.g., 4 eV, a Schottky barrier may be formed between the selection pattern 110 and the lower electrode 100.

Due to the P-N junction and the Schottky barrier by the lower electrode 100, an off-current of the variable resistance memory cell may be reduced without changes of the chemical, mechanical, or electrical characteristics of the selection pattern 110, e.g., the thermal stability, threshold voltage, etc.

The intermediate electrode 120 may be formed between the selection pattern 110 and the variable resistance pattern 130. For example, the intermediate electrode 120 may serve as a heating electrode that may provide a Joule heat to the variable resistance pattern 130.

In an implementation intermediate electrode 120 may include a metal nitride or a metal silicon nitride, e.g., titanium nitride, titanium silicon nitride, tungsten nitride, tungsten silicon nitride, tantalum nitride, tantalum silicon nitride, zirconium nitride, zirconium silicon nitride, etc.

In example embodiments, the intermediate electrode 120 may include carbon, a metal containing carbon, or a metal nitride containing carbon. For example, the intermediate electrode 120 may include carbon, carbonitride, titanium carbonitride, or tantalum carbonitride.

The variable resistance pattern 130 may include a material whose phase may be changed due to the temperature difference caused by the Joule heat transferred from the intermediate electrode 120, and thus the phase of the variable resistance pattern 130 may be changed due to the temperature difference. A resistance of the variable resistance pattern 130 may be changed by the phase change of the variable resistance pattern 130, and thus the variable resistance pattern 130 or the variable resistance memory cell may be converted from a set state into a reset state, or the vice versa. In this case, the variable resistance memory cell may be used in a phase-change random access memory (PRAM) device.

In an example embodiment, the variable resistance pattern 130 may include a chalcogenide material containing germanium, antimony, or tellurium. In an example embodiment, the variable resistance pattern 130 may include a super lattice having an alternately stacked germanium-tellurium layer and antimony-tellurium layer. In an example embodiment, the variable resistance pattern 130 may include germanium-antimony-tellurium (GST), indium-antimony-tellurium (IST), or bismuth-antimony-tellurium (BST).

In example embodiments, the variable resistance pattern 130 may include a material whose resistance may be changed by a magnetic field or a spin transfer torque (STT). In this case, the variable resistance memory cell may be used in a magnetic random access memory (MRAM) device.

In an implementation, the variable resistance pattern 130 may include a ferromagnetic material, e.g., iron (Fe), nickel (Ni), cobalt (Co), dysprosium (Dy), gadolinium (Gd) or the like. In example embodiments, the variable resistance pattern 130 may include a perovskite-based material or a transition metal oxide. In this case, the variable resistance memory cell may be used in a resistive random access memory (ReRAM) device.

The perovskite-based material may include, e.g., STO ($SrTiO_3$), BTO ($BaTiO_3$), PCMO ($Pr_{1-x}Ca_xMnO_3$) or the like. The transition metal oxide may include titanium oxide (TiOx), zirconium oxide (ZrOx), aluminum oxide (AlOx), hafnium oxide (HfOx), tantalum oxide (TaOx), niobium oxide (NbOx), cobalt oxide (CoOx), tungsten oxide (WOx), lanthanum oxide (LaOx), or zinc oxide (ZnOx). These may be used alone or in combination.

The upper electrode 140 may be formed on the variable resistance pattern 130, and may include a metal or a metal nitride, e.g., titanium or titanium nitride.

Referring to FIG. 2, the variable resistance memory cell may have a structure reverse to that of FIG. 1. For example, a selection pattern 110*a* may be disposed over a variable resistance pattern 130*a*. The intermediate electrode 120 may be formed between the variable resistance pattern 130*a* and the selection pattern 110*a*.

An upper electrode 140*a* may be formed on the selection pattern 110*a*. The upper electrode 140*a* may include the n-type semiconductor material or a conductive material having a work function equal to or more than the target work function, e.g., about 4 eV (hereinafter, referred to as a high work function), and the upper electrode 140*a* and the selection pattern 110*a* may form a P-N junction or a Schottky barrier.

A lower electrode 100*a* may contact a lower or outer surface of the variable resistance pattern 130*a*, and may include a metal or a metal nitride, e.g., titanium or titanium nitride. In an example embodiment, the lower electrode 100*a* may be omitted.

Figure 3:
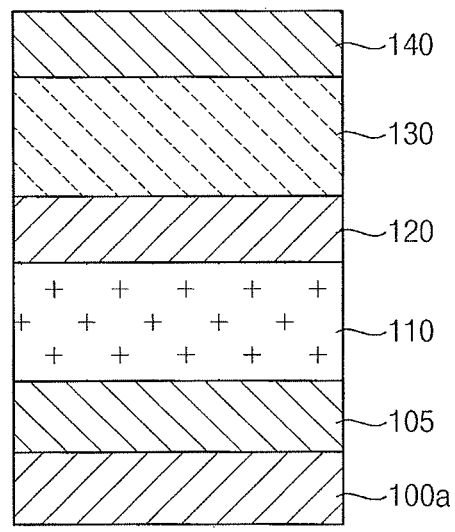
FIGS. 3 and 4 illustrate cross-sectional views of a variable resistance memory cell in accordance with example embodiments.
Figure 4:
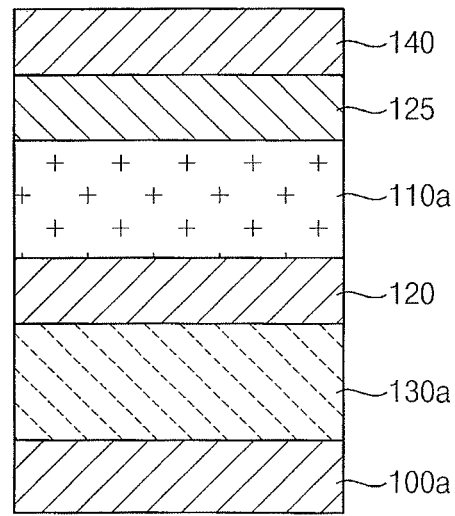

FIGS. 3 and 4 illustrate cross-sectional views of a variable resistance memory cell in accordance with example embodiments.

Referring to FIG. 3, the variable resistance memory cell may include the lower electrode 100*a*, a barrier pattern 105, the selection pattern 110, the intermediate electrode 120, the variable resistance pattern 130, and the upper electrode 140 sequentially stacked.

The lower electrode 100*a* and the upper electrode 140 may include a metal or a metal nitride, e.g., metallic titanium or titanium nitride. The barrier pattern 105 may be between the lower electrode 100*a* and the selection pattern 110, and may include a material that forms a P-N junction or a Schottky barrier together with the selection pattern 110.

In example embodiments, the barrier pattern 105 may include the n-type semiconductor material or a high work function conductive material.

Referring to FIG. 4, the variable resistance memory cell may have a structure reverse to that of FIG. 3. For example, the selection pattern 110*a* may be disposed over the variable resistance pattern 130*a*. The intermediate electrode 120 may be formed between the variable resistance pattern 130*a* and the selection pattern 110*a*.

A barrier pattern 125 may be between the selection pattern 110*a* and the upper electrode 140. The barrier pattern 125 may include the n-type semiconductor material or a high work function conductive material, and may form a P-N junction or a Schottky barrier together with the selection pattern 110*a*.

Figure 5:
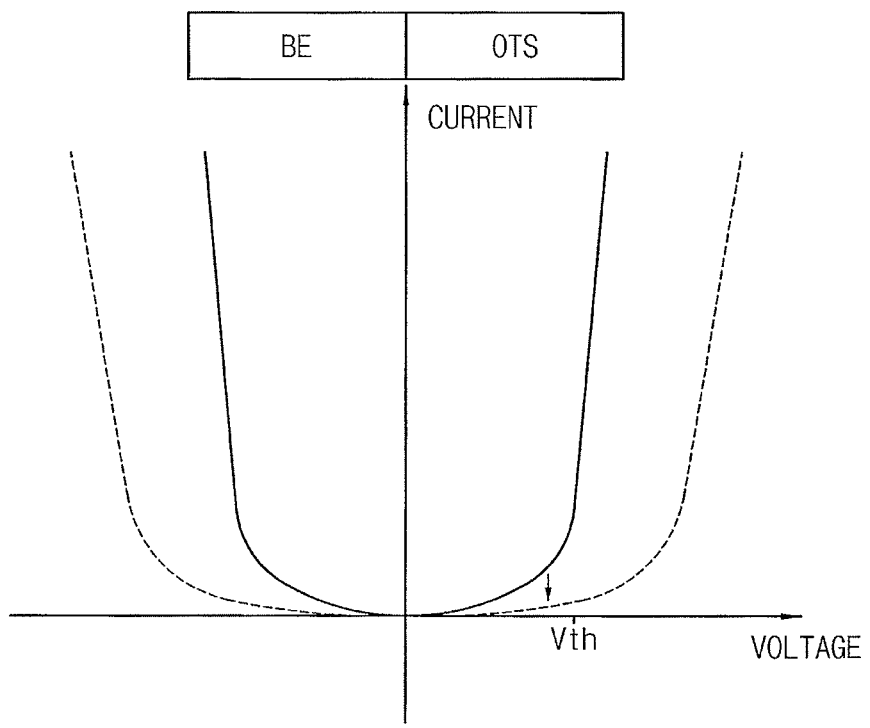
FIG. 5 illustrates a graph showing the decrease of the off-current in a variable resistance memory cell in accordance with example embodiments.

FIG. 5 illustrates a graph showing the decrease of the off-current in a variable resistance memory cell in accordance with example embodiments.

Referring to FIG. 5, as a voltage is applied, a current may flow from the lower electrode BE toward the selection pattern including the OTS material. As the voltage approaches a threshold voltage Vth, the current may increase sharply, and the off-current may be generated before approaching the threshold voltage.

As illustrated with reference to FIGS. 1 to 4, the electrode contacting the selection pattern may include the n-type semiconductor material or the high work function conductive material, and thus a P-N junction or a Schottky barrier may be formed. Accordingly, the off-current may be reduced as shown in FIG. 5.

The off-current may be reduced not by changing the composition or property of the selection pattern but by changing the composition of the electrode contacting the selection pattern. Thus, the disturbance or interference of the variable resistance memory cells by the off-current may be prevented or reduced while maintaining the operation characteristics or durability of the variable resistance memory cells.

Figure 6:
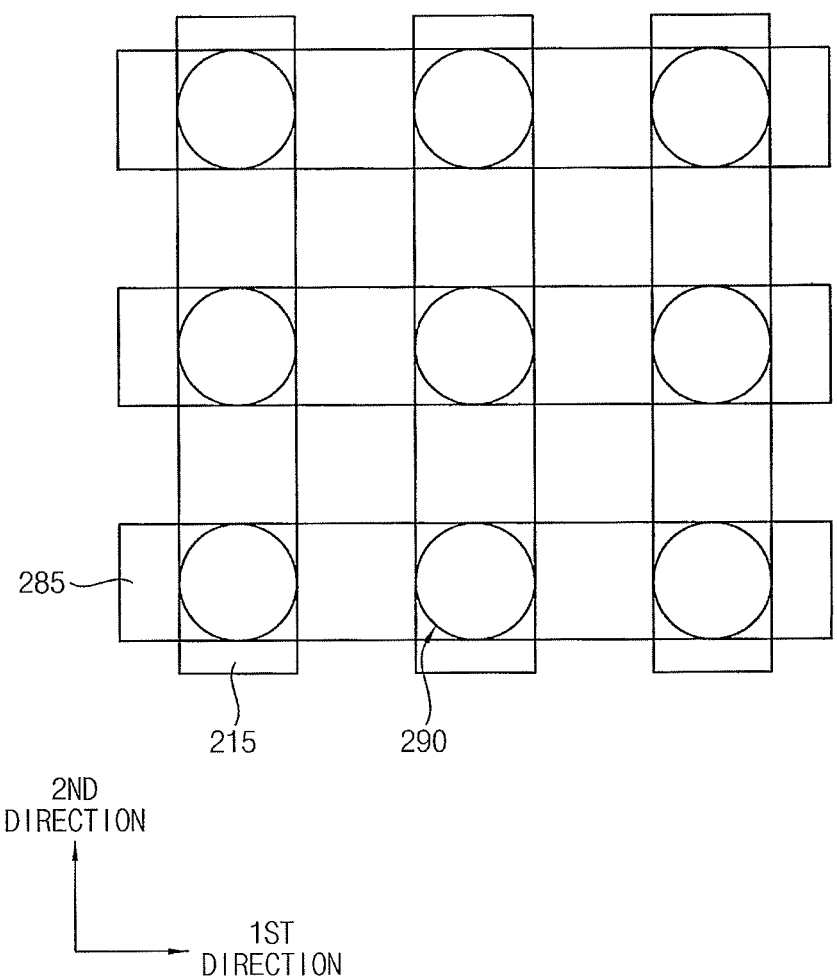
FIGS. 6 to 8 illustrate a plan view and cross-sectional views of a variable resistance memory device in accordance with example embodiments.
Figure 7:
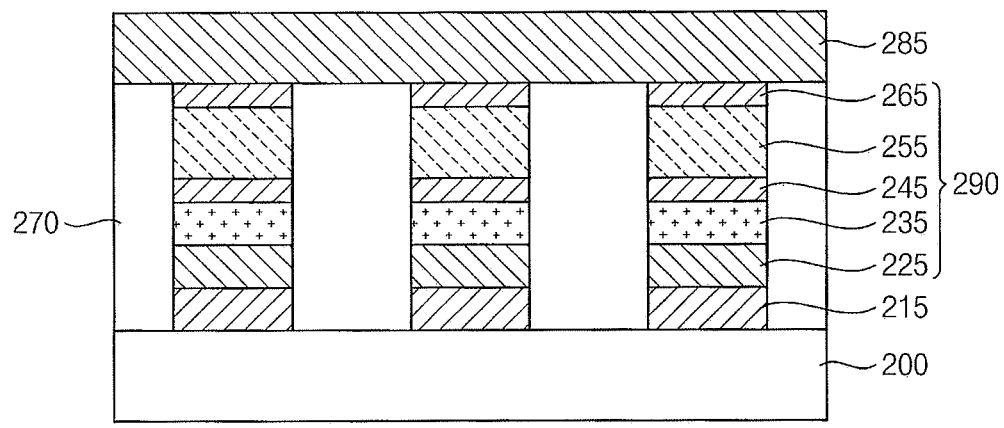
Figure 8:
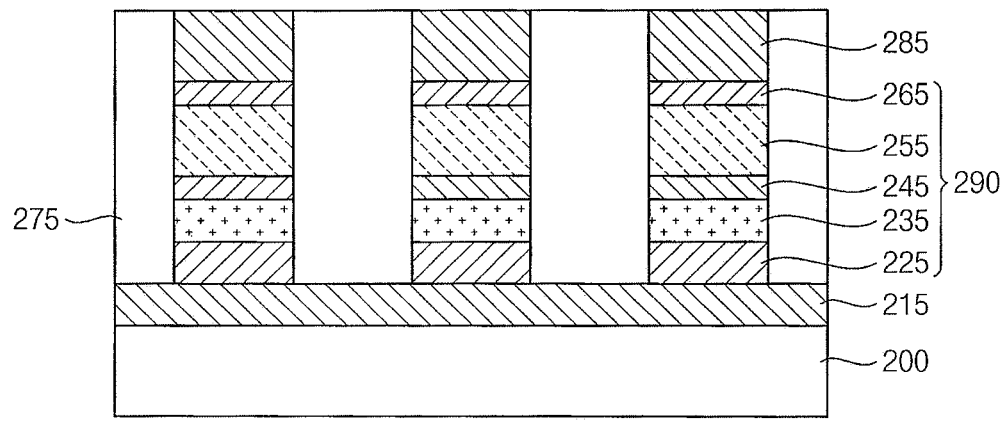

FIGS. 6 to 8 illustrate a plan view and cross-sectional views of a variable resistance memory device in accordance with example embodiments. FIG. 6 is a plan view, FIG. 7 is a cross-sectional view taken along a first direction, and FIG. 8 is a cross-sectional view taken along a second direction.

For example, FIGS. 6 to 8 show a variable resistance memory device having a cross-point cell array in which memory cells are formed in respective areas where conductive lines cross or overlap each other in a plan view.

Hereinafter, two directions substantially parallel to an upper surface of a substrate and crossing each other may be defined as first and second directions, respectively. In example embodiments, the first and second directions may cross each other at a right angle so as to be substantially perpendicular to each other.

Referring to FIGS. 6 to 8, the variable resistance memory device may include a first conductive line 215 and a second conductive line 285 spaced apart from each other in a vertical direction (e.g., orthogonal to a plane formed by the first and second directions) on a substrate 200. Memory cell 290 may be disposed at each area where the first and second conductive lines 215 and 285 overlap with each other in the vertical direction, e.g., in overlapping areas of the first and second conductive lines.

In example embodiments, the first conductive line 215 may serve as a word line of the variable resistance memory device, and the second conductive line 285 may serve as a bit line of the variable resistance memory device. In an implementation, the first conductive line 215 may serve as a bit line of the variable resistance memory device, and the second conductive line 285 may serve as a word line of the variable resistance memory device.

The substrate 200 may include a semiconductor material, e.g., silicon, germanium, silicon-germanium, etc., or III-V semiconductor compounds, e.g., InP, GaP, GaAs, GaSb, etc. In some embodiments, the substrate 200 may be a silicon-on-insulator (SOI) substrate or a germanium-on-insulator (GOI) substrate.

Peripheral circuits including, e.g., transistors, contact plugs, wirings, etc. may be formed on the substrate 200, and may be at least partially covered by a lower insulation layer on the substrate 200.

The first conductive line 215 may be disposed on the substrate 200. For example, the first conductive line 215 may be formed on the lower insulation layer, and may be electrically connected to the peripheral circuits.

The first conductive line 215 may extend in the second direction, and a plurality of first conductive lines 215 may be formed to be adjacent or spaced apart from each other in or along the first direction.

The second conductive line 285 may be disposed on or over the first conductive line 215 and spaced apart from the first conductive line 215 in the vertical direction. The second conductive line 285 may extend in the first direction, and a plurality of second conductive lines 285 may be adjacent or spaced apart from each other in the second direction.

The first and second conductive lines 215 and 285 may include a metal, e.g., tungsten, copper, aluminum, titanium, tantalum, etc.

The memory cell 290 may be formed between the first and second conductive lines 215 and 285, e.g., at each area where the first and second conductive lines 215 and 285 overlap with each other in the vertical direction. Thus, a plurality of memory cells 290 may be formed in each of the first and second directions to define a cross-point cell array.

For example, a plurality of memory cells 290 disposed in the first direction may define a memory cell row. Additionally, a plurality of memory cells 290 disposed in the second direction may define a memory cell column.

In example embodiments, the memory cell 290 may include a lower electrode 225, a selection pattern 235, an intermediate electrode 245, a variable resistance pattern 255, and an upper electrode 265 sequentially stacked. In example embodiments, the lower upper electrode 265 may be omitted.

The lower electrode 225 may include an n-type semiconductor material, as illustrated with reference to FIG. 1. For example, the lower electrode 225 may include silicon, germanium, or silicon-germanium doped with n-type impurities. The lower electrode 225 may include a III-V semiconductor compound doped with n-type impurities.

In example embodiments, the lower electrode 225 may include n-type chalcogenide material.

In some example embodiments, the lower electrode 225 may include a high work function conductive material. In an example embodiment, the lower electrode 225 may include a conductive material having a work function more than about 4 eV, or equal to or more than about 5 eV.

In an example embodiment, the lower electrode 225 may include amorphous carbon or ruthenium. In an example embodiment, the lower electrode 225 may include titanium nitride doped with carbon, e.g., TiCN, or titanium silicide nitride doped with carbon, e.g., TiCSiN.

The selection pattern 235 may include the OTS material. The intermediate electrode 245 or the variable resistance pattern 255 may include materials substantially the same as those illustrated with reference to FIG. 1. The upper electrode 265 may include, e.g., titanium or titanium nitride.

In an example embodiment, the variable resistance pattern 255 may include a phase-change material, e.g., GST, IST, BST, etc.

A first insulation pattern 270 may be between neighboring ones of the memory cell columns in the first direction. For example, the first insulation pattern 270 may extend in the second direction between the first memory cell columns. The first insulation pattern 270 may include, e.g., silicon oxide.

A second insulation pattern 275 may be between neighboring ones of the memory cell rows and neighboring ones of the second conductive lines 285 in the second direction. In an example embodiment, the second insulation pattern 275 may extend in the first direction. The second insulation pattern 275 may include, e.g., silicon oxide.

The first and second insulation patterns 270 and 275 may be merged with each other.

Sidewalls of the memory cells 290 may be surrounded by the first and second insulation patterns 270 and 275 to be divided or insulated from each other.

In the variable resistance memory device having the cross-point cell array structure, if the off-current of the selection pattern 235 including the OTS material were to excessively increase, the operation of the memory cells 290 could be disturbed by the off-current.

In accordance with example embodiments, the lower electrode 225 may include the material that may form a P-N junction or a Schottky barrier together with the selection pattern 235, and thus the off-current may be reduced. Accordingly, the operation reliability of the memory cells 290 may be enhanced, and the cell density of the cross-point cell array structure may be increased.

In an example embodiment, as illustrated with reference to FIG. 3, a barrier pattern may be between the selection pattern 235 and the lower electrode 225. In this case, the lower electrode 225 may include titanium or titanium nitride, and the barrier pattern may include n-type semiconductor material or a high work function conductive material.

FIGS. 9 to 12 illustrate cross-sectional views of stages in a method of manufacturing a variable resistance memory device, e.g., the variable resistance memory device shown in FIGS. 6 to 8, in accordance with example embodiments.

Figure 9:
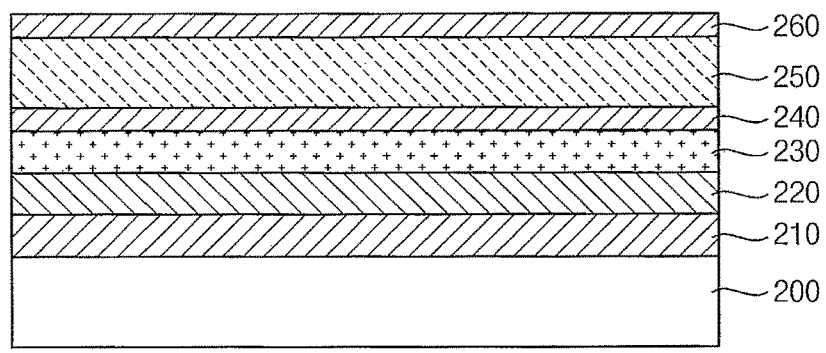
FIGS. 9 to 12 illustrate cross-sectional views of stages in a method of manufacturing a variable resistance memory device, e.g., the variable resistance memory device shown in FIGS. 6 to 8, in accordance with example embodiments.
Figure 10:
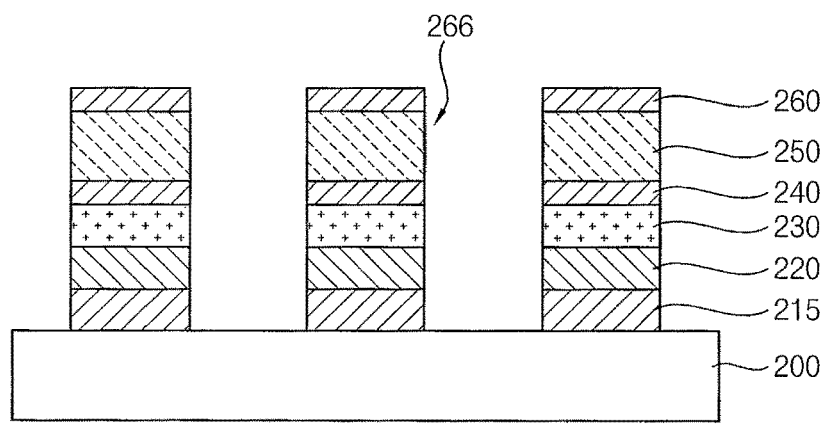
Figure 11A:
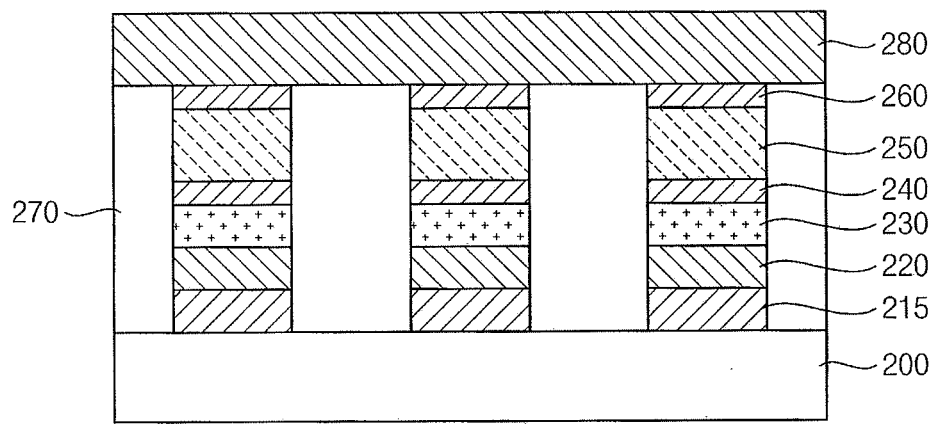
Figure 11B:
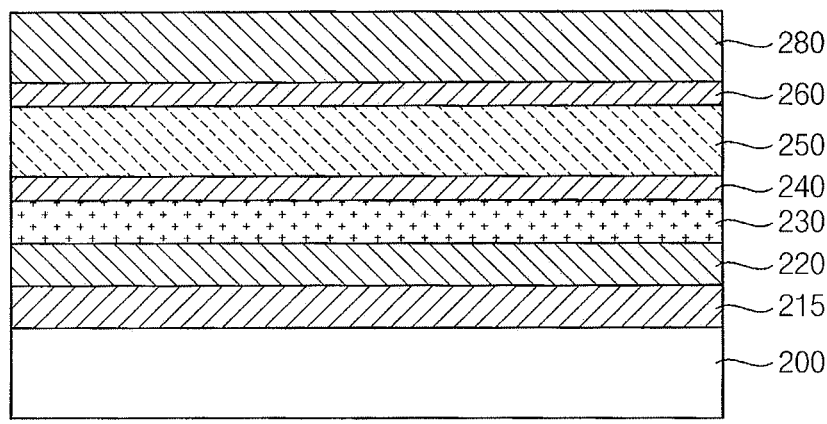
Figure 12:
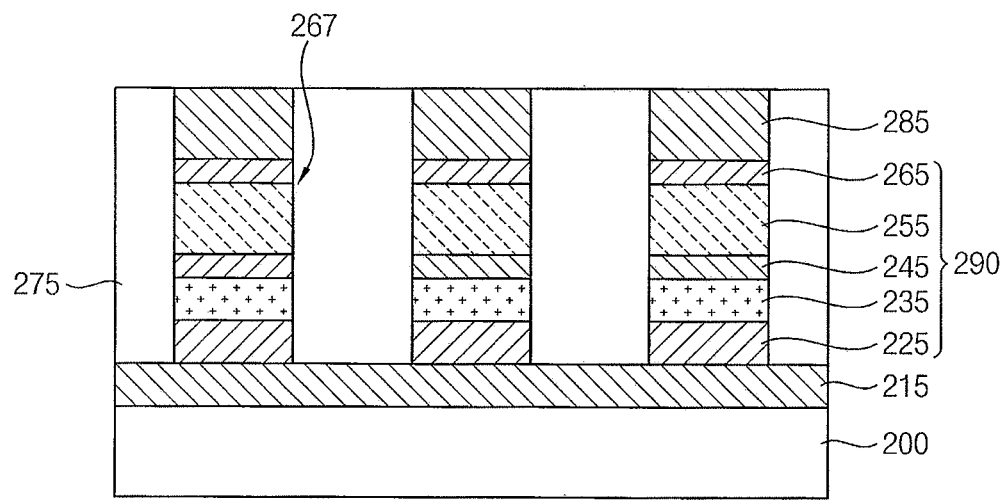

Particularly, FIGS. 9, 10 and 11A are cross-sectional views taken along the first direction, and FIGS. 11B and 12 are cross-sectional views taken along the second direction.

Referring to FIG. 9, a first conductive layer 210, a lower electrode layer 220, a selection material layer 230, an intermediate electrode layer 240, a variable resistance material layer 250, and an upper electrode layer 260 may be sequentially formed on a substrate 200.

The substrate 200 may include a semiconductor material, e.g., silicon, germanium, silicon-germanium, etc., or III-V semiconductor compounds, e.g., InP, GaP, GaAs, GaSb, etc. In some embodiments, the substrate 200 may be an SOI substrate or a GOI substrate.

In example embodiments, peripheral circuits including, e.g., transistors, contact plugs, wirings, etc. may be formed on the substrate 200, and may be at least partially covered by a lower insulation layer on the substrate 200.

The first conductive layer 210 may be formed of a metal, e.g., tungsten, copper, aluminum, titanium, tantalum, etc. The upper electrode layer 260 may be formed of a metal or a metal nitride, e.g., metallic titanium or titanium nitride. The intermediate electrode layer 240 may be formed of a metal, a metal nitride, or a metal silicon nitride having a resistance greater than those of the upper electrode layer 260 and/or the first conductive layer 210. The intermediate layer 240 may be formed of carbon, a metal containing carbon, or a metal nitride containing carbon, e.g., carbon, carbonitride, titanium carbonitride, or tantalum carbonitride.

The selection material layer 230 may be formed of the above-mentioned OTS material. The variable resistance material layer 250 may be formed of a phase-change material, e.g., GST, IST, BST, etc. In an example embodiment, the variable resistance material layer 250 may be formed of a ferromagnetic material. In an example embodiment, the variable resistance material layer 250 may be formed of a perovskite-based material or a transition metal oxide.

In example embodiments, the lower electrode layer 220 may be formed of the n-type semiconductor material or the high work function conductive material.

The first conductive layer 210, the lower electrode layer 220, the selection material layer 230, the intermediate electrode layer 240, the variable resistance material layer 250, and the upper electrode layer 260 may be formed by, e.g., a physical vapor deposition (PVD) process, a sputtering process, an atomic layer deposition (ALD) process, or a chemical vapor deposition (CVD) process, etc.

Referring to FIG. 10, the upper electrode layer 260, the variable resistance material layer 250, the intermediate electrode layer 240, the selection material layer 230, the lower electrode layer 220 and the first conductive layer 210 may be partially etched.

In example embodiments, a first mask may be formed on the upper electrode layer 260 to extend in the second direction. An etching process may be performed using the first mask as an etching mask until the first conductive layer 210 is divided into a plurality of first conductive lines 215.

By the etching process, each of the upper electrode layer 260, the variable resistance material layer 250, the intermediate electrode layer 240, the selection material layer 230, and the lower electrode layer 220 may be transformed into a line pattern extending in the second direction.

A first opening 266 may be formed between a structure including the first conductive line 215 and the line patterns sequentially stacked to extend in the second direction.

Referring to FIGS. 11A and 11B, a first insulation pattern 270 may fill the first opening 266, and a second conductive layer 280 may be formed on the first insulation pattern 270 and the upper electrode layer 260.

For example, a first insulation layer may be formed on the substrate 200 and the upper electrode layer 260 to sufficiently fill the first opening 266. The first insulation layer may be planarized until an upper surface of the upper electrode layer 260 may be exposed to form the first insulation pattern 270.

The first insulation layer may be formed of, e.g., silicon oxide by a CVD process or an ALD process. The second conductive layer 280 may be formed of a metal substantially the same as that of the first conductive layer 210.

Referring to FIG. 12, the second conductive layer 280 may be etched along the first direction to form second conductive lines 285.

For example, a second mask may be formed on the second conductive layer 280 to extend in the first direction. The second conductive layer 280 may be partially etched using the second mask as an etching mask to form the second conductive lines 285.

The upper electrode layer 260, the variable resistance material layer 250, the intermediate electrode layer 240, the selection material layer 230, and the lower electrode layer 220 may be sequentially etched until an upper surface of the first conductive line 215 may be exposed. By the etching process, the first insulation pattern 270 may be partially etched to form a second opening 267 extending in the first direction.

By the etching process, a memory cell 290 including a sequentially stacked lower electrode 225, selection pattern 235, intermediate electrode 245, variable resistance pattern 255, and upper electrode 265 may be formed at each area where the first and second conductive lines 215 and 285 overlap with each other in the vertical direction.

A second insulation layer may be formed on the conductive line 215 and the second conductive line 285 to sufficiently fill the second opening 267. The second insulation layer may be planarized until an upper surface of the second conductive line 285 may be exposed to form a second insulation pattern 275 filling the second opening 267.

The second insulation layer may be formed of a material substantially the same as that of the first insulation layer, e.g., silicon oxide. The first and second insulation patterns 270 and 275 may be merged with each other, e.g., may be a monolithic insulation pattern.

Figure 13:
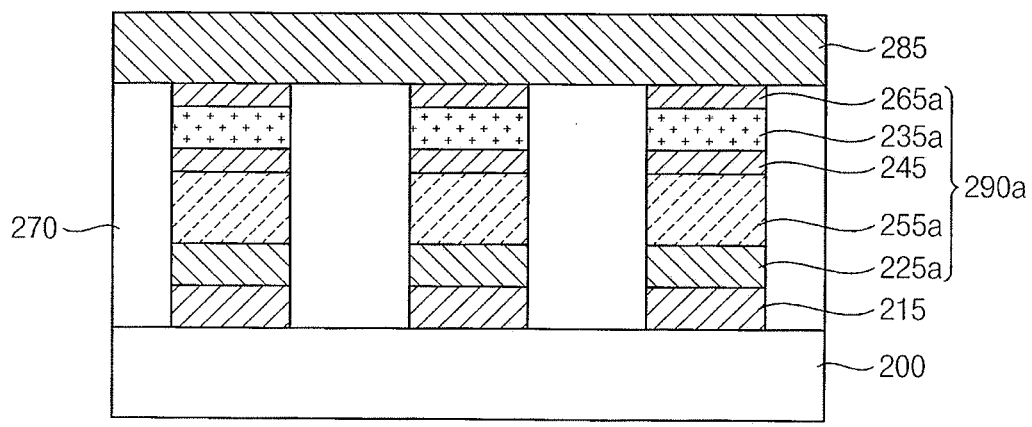
FIGS. 13 and 14 illustrate cross-sectional views of a variable resistance memory device in accordance with example embodiments.
Figure 14:
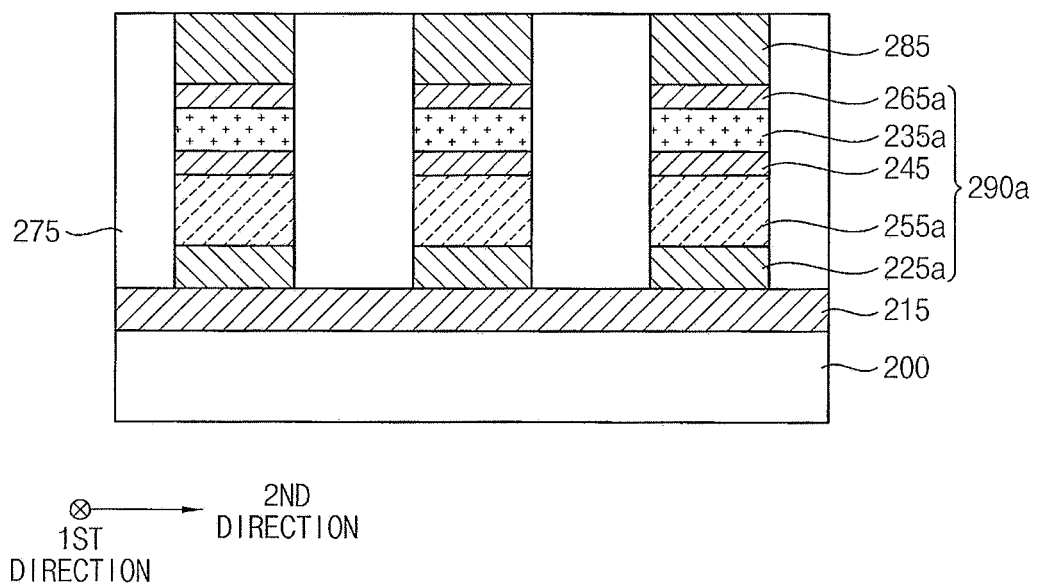

FIGS. 13 and 14 illustrate cross-sectional views of a variable resistance memory device in accordance with example embodiments. For example, FIG. 13 illustrates a cross-sectional view of the variable resistance memory device taken along the first direction, and FIG. 14 illustrates a cross-sectional view of the variable resistance memory device taken along the second direction.

The variable resistance memory device may include elements substantially the same as or similar to that illustrated with reference to FIGS. 6 to 8, and detailed descriptions thereon may be omitted below in the interest of brevity.

Referring to FIGS. 13 and 14, a memory cell 290*a* may have a structure reverse to that of FIGS. 6 to 8. In example embodiments, in the memory cell 290*a*, the selection pattern may be disposed over the variable resistance pattern.

For example, the memory cell 290*a* may include a lower electrode 225*a*, a variable resistance pattern 255*a*, an intermediate electrode 245, a selection pattern 235*a*, and an upper electrode 265*a* sequentially stacked on the first conductive line 215.

The lower electrode 225*a* may include a metal or a metal nitride, e.g., metallic titanium or titanium nitride. The upper electrode 265*a* may include the n-type semiconductor material or the high work function conductive material.

Thus, a P-N junction or a Schottky barrier may be formed between the selection pattern 235*a* and the upper electrode 265*a*, and the off-current in the selection pattern 235*a* or the memory cell 290*a* may be reduced.

In an example embodiment, the lower electrode 225*a* may be omitted. In an example embodiment, as illustrated with reference to FIG. 4, a barrier pattern may be between the selection pattern 235*a* and the upper electrode 265*a*. In this case, the upper electrode 265*a* may include metallic titanium or titanium nitride, and the barrier pattern may include the n-type semiconductor material or the high work function conductive material.

Figure 15:
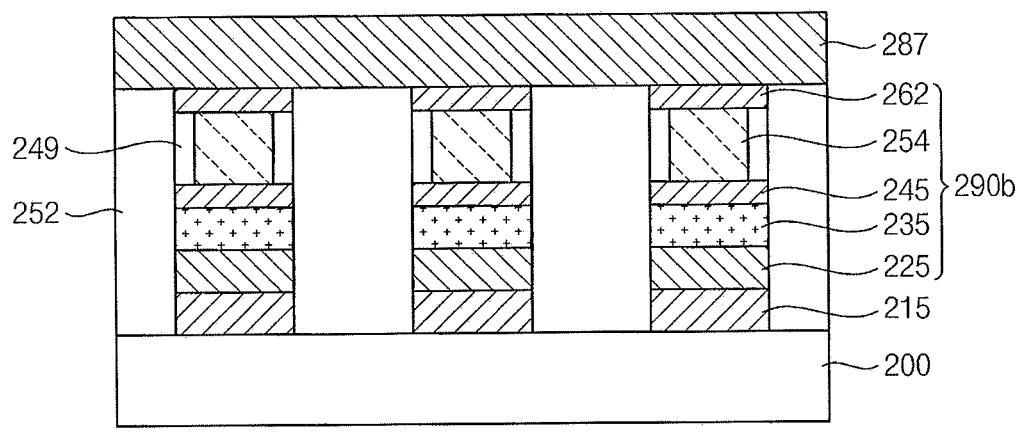
FIGS. 15 and 16 illustrate cross-sectional views of a variable resistance memory device in accordance with example embodiments.
Figure 16:
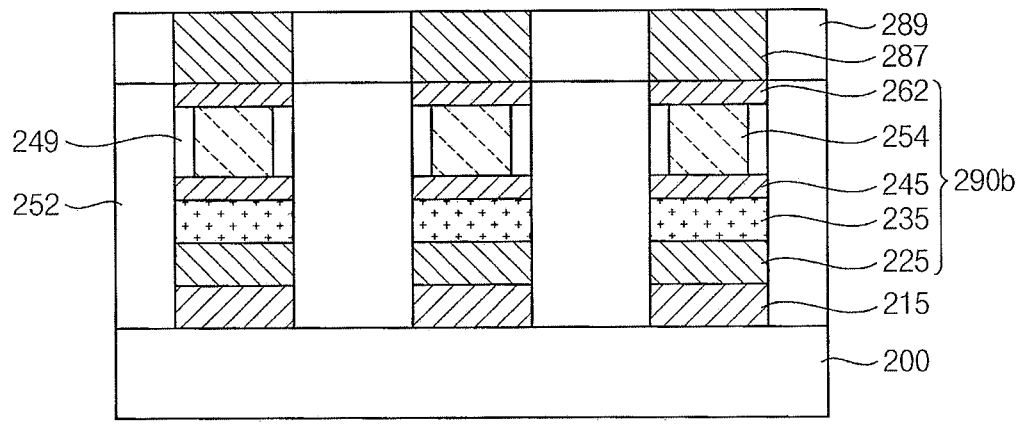

FIGS. 15 and 16 illustrate cross-sectional views of a variable resistance memory device in accordance with example embodiments. For example, FIG. 15 illustrates a cross-sectional view of the variable resistance memory device taken along the first direction, and FIG. 16 illustrates a cross-sectional view of the variable resistance memory device taken along the second direction.

The variable resistance memory device may include elements substantially the same as or similar to that illustrated with reference to FIGS. 6 to 8, and detailed descriptions thereon may be omitted below in the interest of brevity.

Referring to FIGS. 15 and 16, the first conductive lines 215 and second conductive lines 287 may be spaced apart from each other and cross each other in the vertical direction.

A memory cell 290*b* may be disposed at each area where the first and second conductive lines 215 and 287 overlap with each other in the vertical direction.

The memory cell 290*b* may include the lower electrode 225, the selection pattern 235, the intermediate electrode 245, a variable resistance pattern 254, and an upper electrode 262 sequentially stacked between the first and second conductive lines 215 and 287.

As illustrated with reference to FIGS. 6 to 8, the lower electrode 225 may include the n-type semiconductor material or the high work function conductive material, and a P-N junction or a Schottky barrier may form together with the selection pattern 235.

In example embodiments, the variable resistance pattern 254 may have a width or an area that is less than an area of the intermediate electrode 245 or the selection pattern 235 in a plan view. For example, at least a portion of an outer edge of the intermediate electrode 245 may not contact the variable resistance pattern 254.

A spacer 249 may be formed on a sidewall of the variable resistance pattern 254. For example, the spacer 249 may surround a sidewall of the variable resistance pattern 254. The spacer 249 may include, e.g., silicon nitride, silicon oxynitride, etc.

As described above, the width or area of the variable resistance pattern 254 may be reduced by the spacer 249. Thus, the efficiency of heat transfer from the intermediate electrode 245 to the variable resistance pattern 254 may be enhanced.

The upper electrode 262 may cover upper or outer surfaces of the spacer 249 and the variable resistance pattern 254.

The memory cells 290*b* and the first conductive lines 215 may be divided and insulated from each other by a first insulation layer 252. The second conductive lines 287 may be divided and insulated from each other by a second insulation layer 289. The first and second insulation layers 252 and 289 may include, e.g., silicon oxide.

In example embodiments, as illustrated with reference to FIG. 3, a barrier pattern may be between the selection pattern 235 and the lower electrode 225. In this case, the lower electrode 225 may include metallic titanium or titanium nitride, and the barrier pattern may include the n-type semiconductor material or the high work function conductive material.

FIGS. 17 to 23 illustrate cross-sectional views of stages in a method of manufacturing a variable resistance memory device, e.g., the variable resistance memory device shown in FIGS. 15 and 16, in accordance with example embodiments.

For example, FIGS. 17 to 23 are cross-sectional views taken along the first direction.

Descriptions of processes substantially the same as or similar to those illustrated with reference to FIGS. 9 to 12 may be omitted herein.

Figure 17:
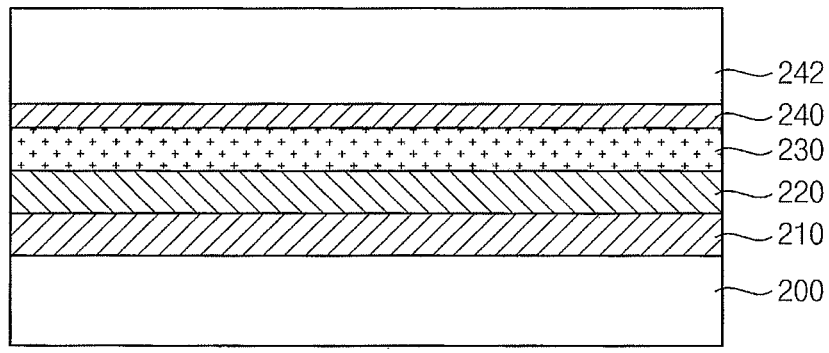
FIGS. 17 to 23 illustrate cross-sectional views of stages in a method of manufacturing a variable resistance memory device, e.g., the variable resistance memory device shown in FIGS. 15 and 16, in accordance with example embodiments.

Referring to FIG. 17, the first conductive layer 210, the lower electrode layer 220, the selection material layer 230, the intermediate electrode layer 240, and a sacrificial layer 242 may be sequentially formed on the substrate 200.

The sacrificial layer 242 may be formed of a nitride, e.g., silicon nitride by a CVD process, an ALD process, or a PVD process.

Figure 18:
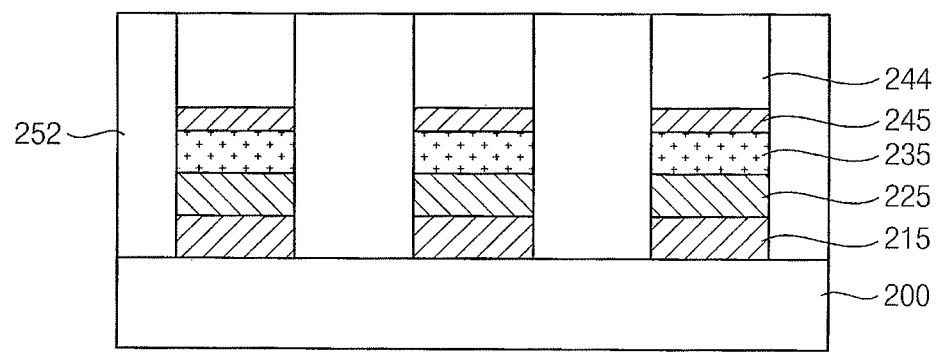

Referring to FIG. 18, the sacrificial layer 242, the intermediate electrode layer 240, the selection material layer 230, the lower electrode layer 220, and the first conductive layer 210 may be partially etched to form the first conductive line 215, the lower electrode 225, the selection pattern 235, the intermediate electrode 245 and a sacrificial pattern 244 sequentially stacked on the substrate 200.

For example, the sacrificial layer 242, the intermediate electrode layer 240, the selection material layer 230, the lower electrode layer 220, and the first conductive layer 210 may be etched along the second direction. Thus, the first conductive lines 215 may be formed from the first conductive layer 210, and each of the sacrificial layer 242, the intermediate electrode layer 240, the selection material layer 230, and the lower electrode layer 220 may be transformed into a line pattern extending in the second direction. A first filling insulation layer may be formed between the first conductive lines 215 and between the line patterns and between the first conductive lines 215.

The line patterns and the first filling insulation layer may be etched along the first direction.

Thus, a pillar structure including the lower electrode 225, the selection pattern 235, the intermediate electrode 245, and the sacrificial pattern 244 sequentially stacked may be formed on the first conductive line 215.

A second filling insulation layer may fill spaces between the pillar structures. The second filling insulation layer may extend in the second direction. The first and second filling insulation layers may be merged with each other to define a first insulation layer 252.

Figure 19:
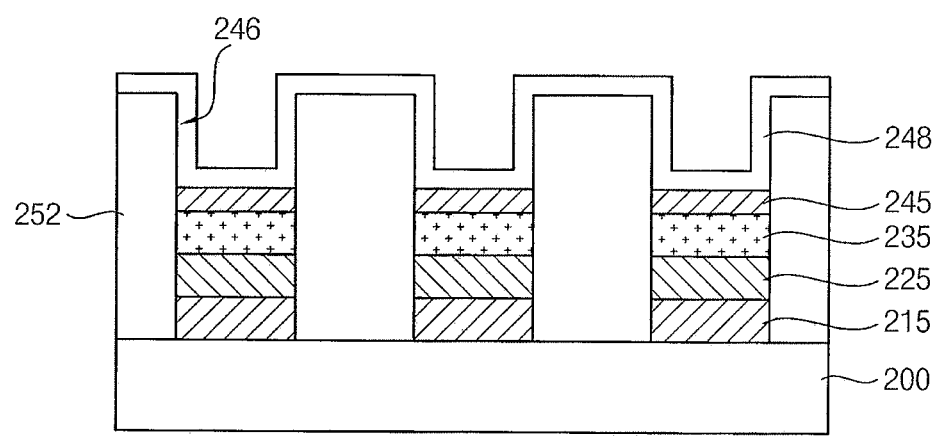

Referring to FIG. 19, the sacrificial pattern 244 may be removed from the first pillar structure, and a first hole 246 may be formed to expose an upper or outer surface of the intermediate electrode 145. For example, the first sacrificial pattern 244 may be removed by a wet etching process using an etching solution having an etching selectivity with respect to nitride, e.g., phosphoric acid or nitric acid.

A spacer layer 248 may be conformally formed on the exposed upper surface of the intermediate electrode 245, a sidewall of the first hole 246 and an upper surface of the first insulation layer 252. For example, the spacer layer 248 may be formed of, e.g., silicon nitride, silicon oxynitride, etc., by an ALD process.

Figure 20:
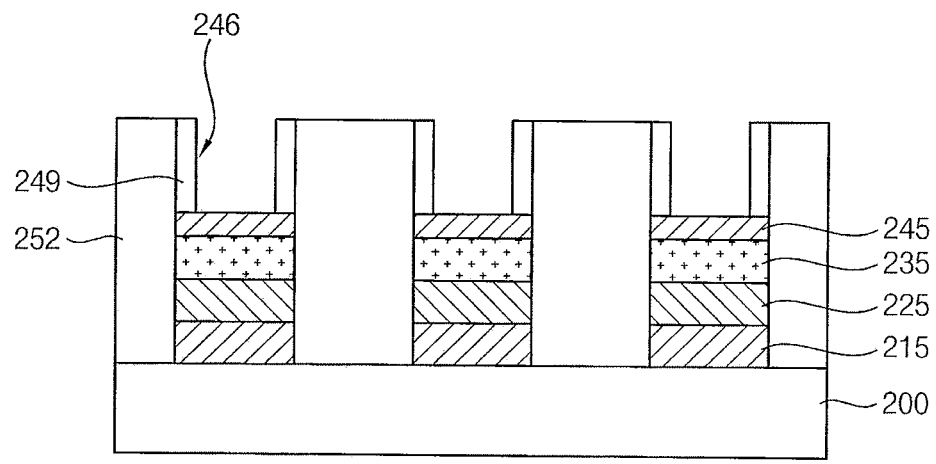

Referring to FIG. 20, the spacer layer 248 may be partially etched by an anisotropic etching process to form a spacer 249.

In example embodiments, portions of the spacer layer 248 on the upper surfaces of the intermediate electrode 245 and the first insulation layer 252 may be removed. Thus, the spacer 249 may be formed on the sidewall of the first hole 246.

Figure 21:
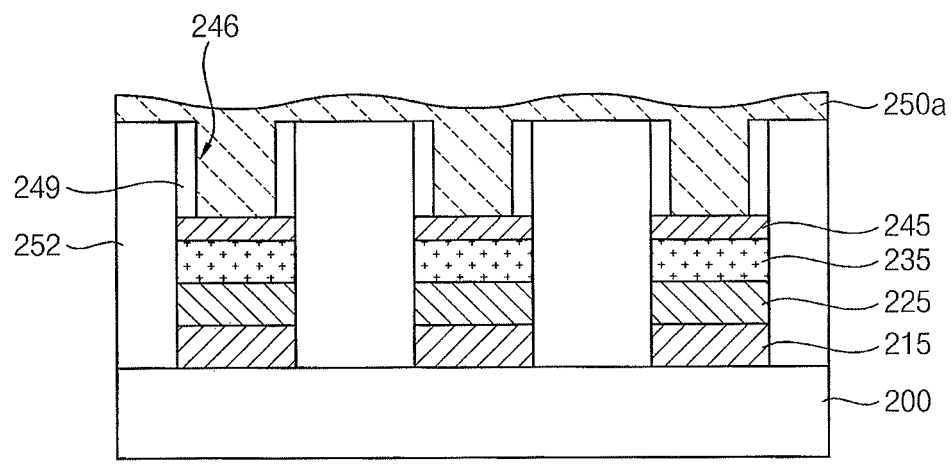

Referring to FIG. 21, a variable resistance material layer 250a may be formed on the intermediate electrode 245 and the first insulation layer 252 to sufficiently fill the first hole 246.

Figure 22:
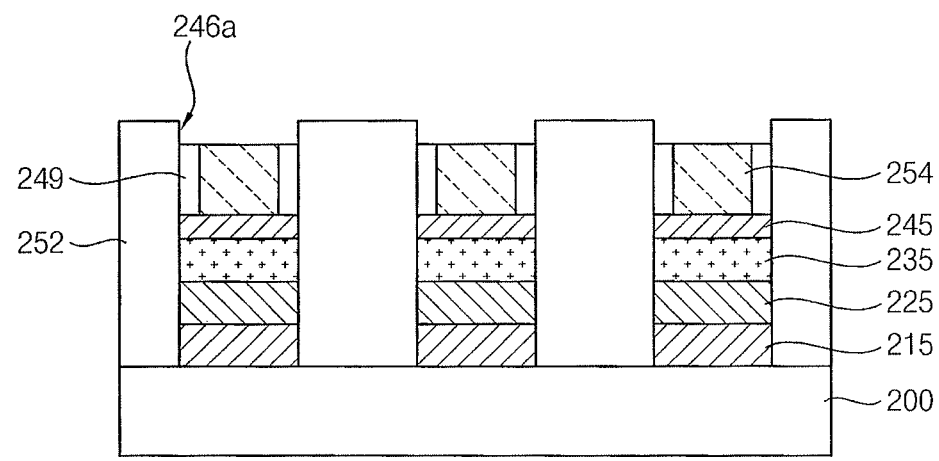

Referring to FIG. 22, the variable resistance material layer 250a may be planarized until an upper surface of the first insulation layer 152 is exposed by, e.g., a CMP process.

Portions of the spacer 249 and the variable resistance material layer 250a at an upper or open portion of the first hole 246 may be removed by an etch back process. Thus, a variable resistance pattern 254 of which a sidewall is covered by the spacer 249 may be formed. Additionally, a second hole 246a may be defined by the upper or open portion of the first hole 246.

Figure 23:
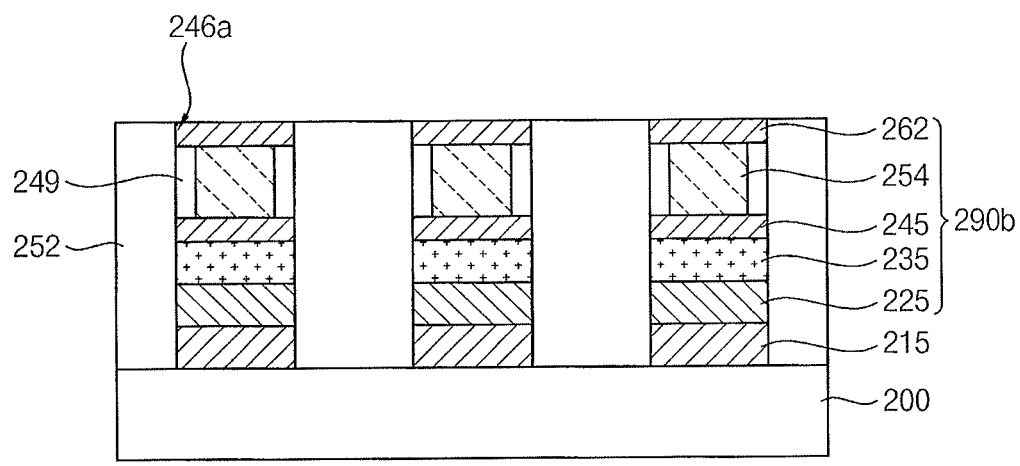

Referring to FIG. 23, an upper electrode 262 may be formed in the second hole 246a to cover upper surfaces of the spacer 249 and the variable resistance pattern 254.

In example embodiments, an upper electrode layer may be formed on the spacer 249, the variable resistance pattern 254 and the first insulation layer 252 to sufficiently fill the second hole 246a, and may be planarized until an upper surface of the first insulation layer 252 is exposed by a CMP process, so that the upper electrode 262 may be formed to fill the second hole 246a.

As described above, the variable resistance pattern 254 having a reduced width and/or area by the spacer 249 may be formed by a damascene process. The upper electrode 262 may be self-aligned by the second hole 246a.

The lower electrode 225, the selection pattern 235, the intermediate electrode 245, the variable resistance pattern 254, and the upper electrode 262 sequentially stacked on the first conductive line 215 may define a memory cell 290b.

Referring to FIGS. 15 and 16 again, a second conductive layer may be formed on the first insulation layer 152 and the upper electrodes 262, and may be etched along the first direction to form a plurality of second conductive lines 287 each extending in the first direction on a plurality of upper electrodes 262. A second insulation layer 289 may be formed on the first insulation layer 152 to fill spaces between the second conductive lines 287.

Figure 24:
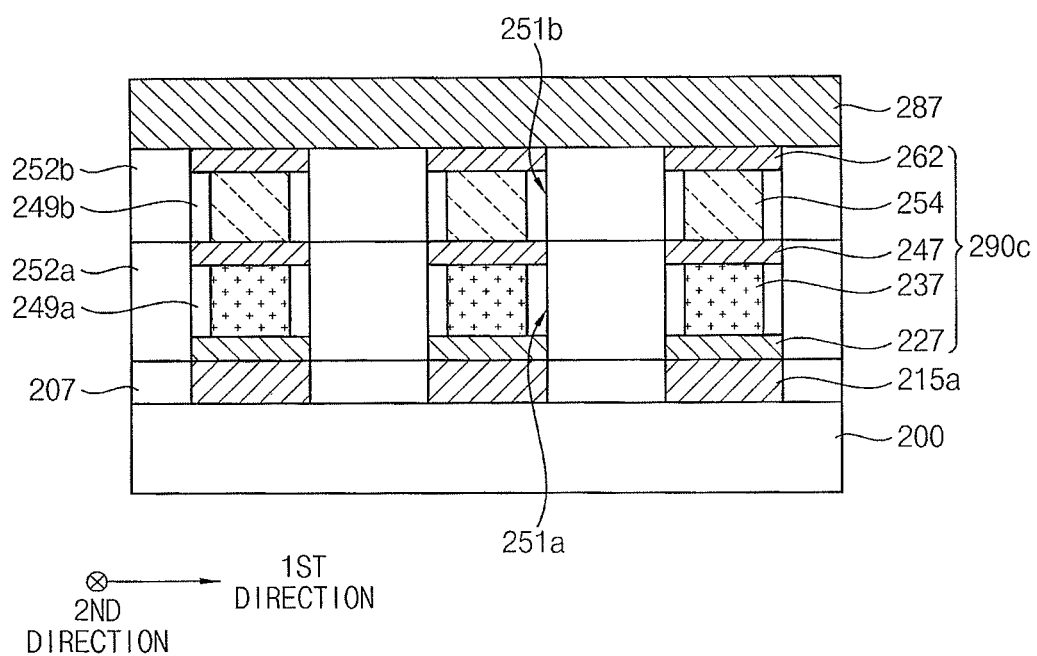
FIGS. 24 and 25 illustrate cross-sectional views illustrating a variable resistance memory device in accordance with example embodiments.
Figure 25:
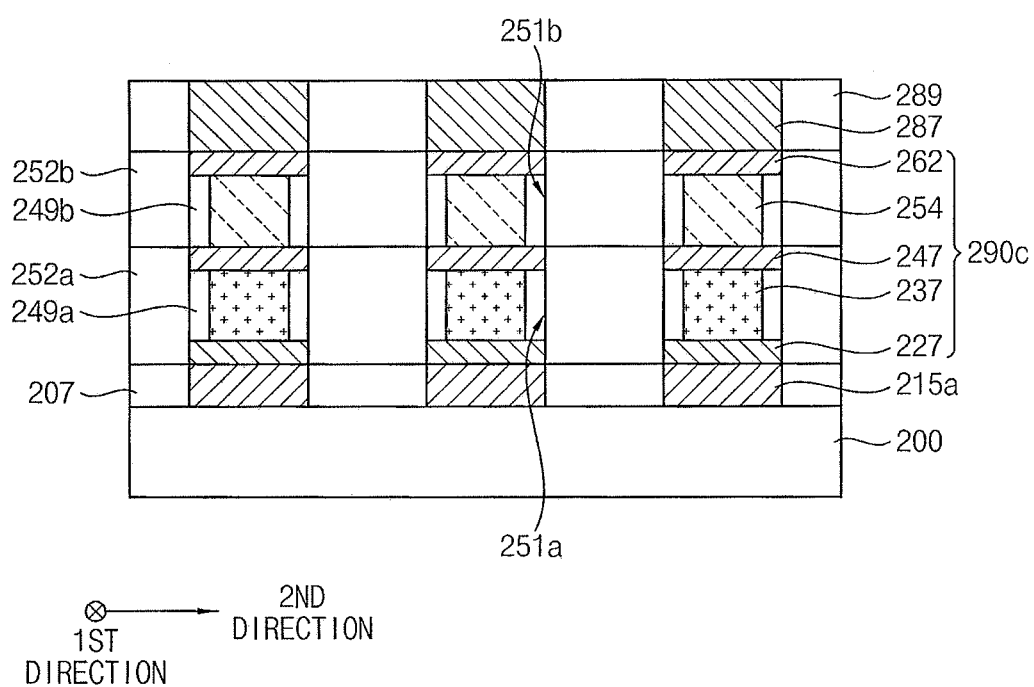

FIGS. 24 and 25 illustrate cross-sectional views of a variable resistance memory device in accordance with example embodiments. For example, FIG. 24 is a cross-sectional view of the variable resistance memory device taken along the first direction, and FIG. 25 is a cross-sectional view of the variable resistance memory device taken along the second direction.

The variable resistance memory device may include elements substantially the same as or similar to those of the variable resistance memory device illustrated with reference to FIGS. 15 and 16. Thus, like reference numerals refer to like elements, and detailed descriptions thereon may be omitted below in the interest of brevity.

Referring to FIGS. 24 and 25, a selection pattern 237 included in a memory cell 290c may be formed by a damascene process.

For example, a lower insulation layer 207 and a first conductive line 215a may be formed on the substrate 200, and a lower electrode layer and a sacrificial layer (not shown) may be sequentially formed on the lower insulation layer 107 and the first conductive line 215a. The lower electrode layer may be formed of the n-type semiconductor material or the high work function conductive material.

The lower electrode layer and the sacrificial layer may be etched along the first and second directions as illustrated with reference to FIG. 18 to form a pillar structure including the lower electrode 227 and a sacrificial pattern. A first insulation layer 252a may be formed to surround a sidewall of the pillar structure.

The sacrificial pattern may be removed to form a first hole 251a exposing an upper surface of the lower electrode 227. A first spacer 249a may be formed on a sidewall of the first hole 251a by processes substantially the same as or similar to those illustrated with reference to FIGS. 19 and 20.

A selection material layer may be formed to fill the first hole 251a, and an upper portion of the selection material layer may be removed by a CMP process and an etch back process to form a selection pattern 237. By the etch back process, the first spacer 249a may be partially etched, and a sidewall of the selection pattern 237 may be surrounded by the first spacer 249a.

An intermediate electrode 247 may be formed on the selection pattern 237b and the first spacer 249a to fill an upper portion of the first hole 251a.

By the damascene process, the selection pattern 237 may be surrounded by the first spacer 249a, and an area of the selection pattern 237 may be less than that of the intermediate electrode 247 in a plan view. For example, a width of the selection pattern 237 may be smaller than that of the intermediate electrode 247 in a side sectional view.

A second insulation layer 252b may be formed on the first insulation layer 252a to cover the intermediate electrode 247. The second insulation layer 252b may be partially etched to form a second hole 251b exposing an upper surface of the intermediate electrode 247.

The variable resistance pattern 254 may be formed in the second hole 251b. In an example embodiment, the variable resistance pattern 254 may be formed by processes substantially the same as or similar to those illustrated with reference to FIGS. 19 to 22.

For example, a second spacer 249b may be formed on a sidewall of the second hole 251b, and a sidewall of the variable resistance pattern 254 may be surrounded by the second spacer 249b. The upper electrode 262 may be formed on the variable resistance pattern 254 and the second spacer 249b to fill an upper portion of the second hole 251b.

Figure 26:
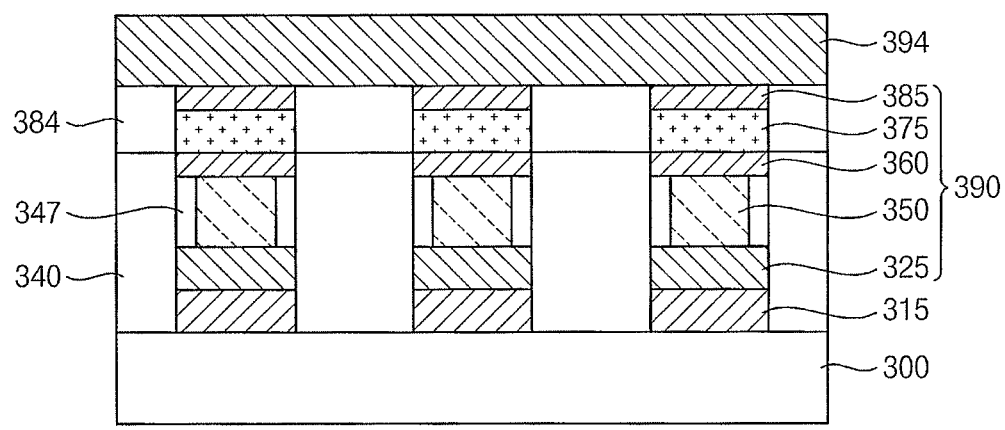
FIGS. 26 and 27 illustrate cross-sectional views of a variable resistance memory device in accordance with example embodiments.
Figure 27:
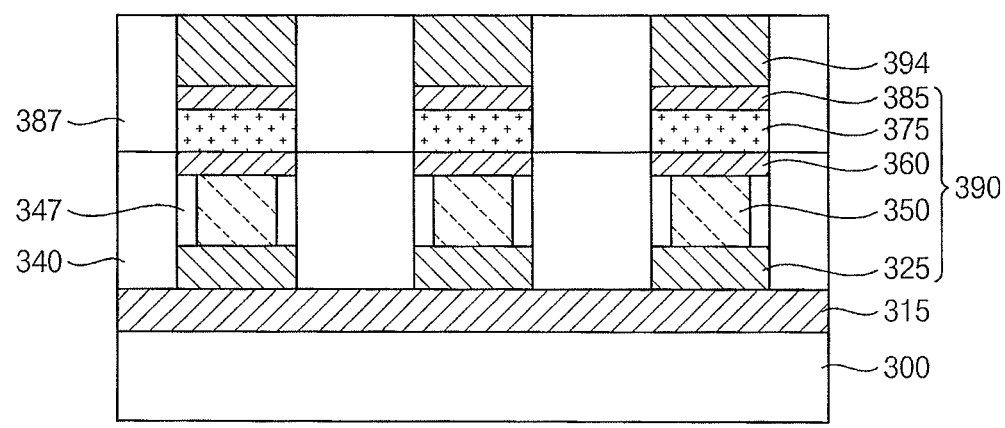

FIGS. 26 and 27 illustrate cross-sectional views of a variable resistance memory device in accordance with example embodiments. For example, FIG. 26 is a cross-sectional view of the variable resistance memory device taken along the first direction, and FIG. 27 is a cross-sectional view taken along the second direction.

The variable resistance memory device may include elements substantially the same as or similar to those of the variable resistance memory device illustrated with reference to FIGS. 6 to 8 or FIGS. 15 and 16. Thus, detailed descriptions on the common elements may be omitted below in the interest of brevity.

Referring to FIGS. 26 and 27, a first conductive line 315 and a second conductive line 394 may be spaced apart from each other and may cross each other in the vertical direction. The first conductive line 315 may extend in the second direction, and a plurality of first conductive lines 315 may be spaced apart from each other in the first direction. The second conductive line 394 may extend in the first direction, and a plurality of second conductive lines 394 may be spaced apart from each other in the second direction.

A memory cell 390 may be formed at each area where the first and second conductive lines 315 and 394 overlap with each other in the vertical direction to form a cross-point cell array.

The memory cell 390 may have a structure that is reverse to that of the memory cell 290b of the variable resistance memory device shown in FIGS. 15 and 16. In the memory cell 390, the selection pattern may overlie the variable resistance pattern.

For example, the memory cell 390 may include a lower electrode 325, a variable resistance pattern 350, an intermediate electrode 360, a selection pattern 375, and an upper electrode 385 sequentially stacked on the first conductive line 315.

The lower electrode 325 may include a metal or a metal nitride, e.g., metallic titanium or titanium nitride. The upper electrode 385 may include the n-type semiconductor material or the high work function conductive material.

Thus, a P-N junction or a Schottky barrier may be formed between the upper electrode 385 and the selection pattern 375, so that the off-current in the selection pattern 375 or the memory cell 390 may be reduced.

In example embodiments, the lower electrode 325 may be omitted. In example embodiments, as illustrated with reference to FIG. 4, a barrier pattern may be between the selection pattern 375 and the upper electrode 385. In this case, the upper electrode may include metallic titanium or titanium nitride, and the barrier pattern may include the n-type semiconductor material or the high work function conductive material.

In example embodiments, the variable resistance pattern 350 may have a shape substantially the same as or similar to that of FIGS. 15 and 16. The variable resistance pattern 350 may have a reduced width and/or area due to the spacer 347.

The memory cells 390, the first conductive lines 315 and the second conductive lines 394 may be divided or insulated from each other by first to third insulation layers 340, 384, and 387.

FIGS. 28 to 37 illustrate cross-sectional views of stages in a method of manufacturing a variable resistance memory device, e.g., the variable resistance memory device of FIGS. 26 and 27, in accordance with example embodiments.

Figure 34:
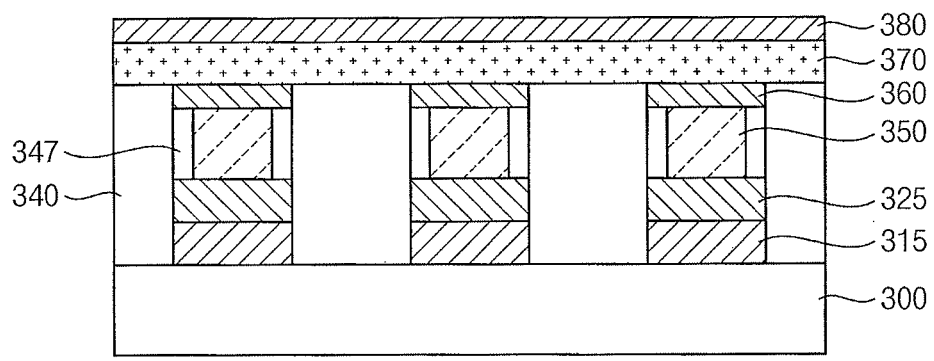
Figure 35:
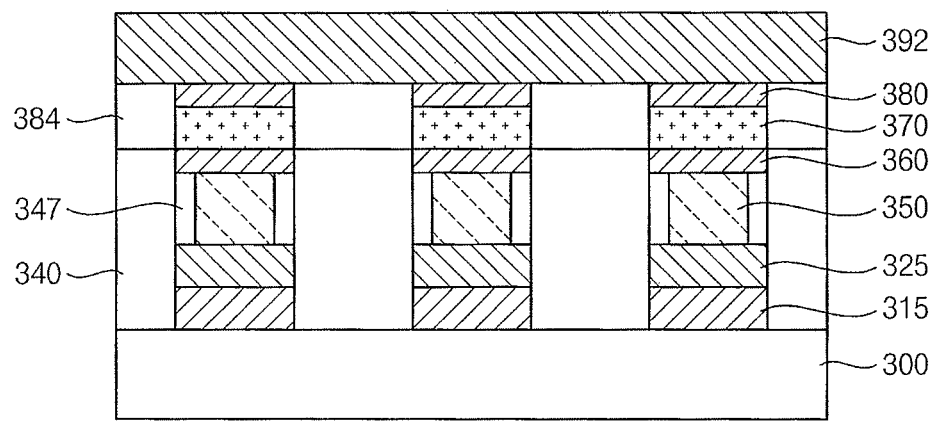
Figure 36:
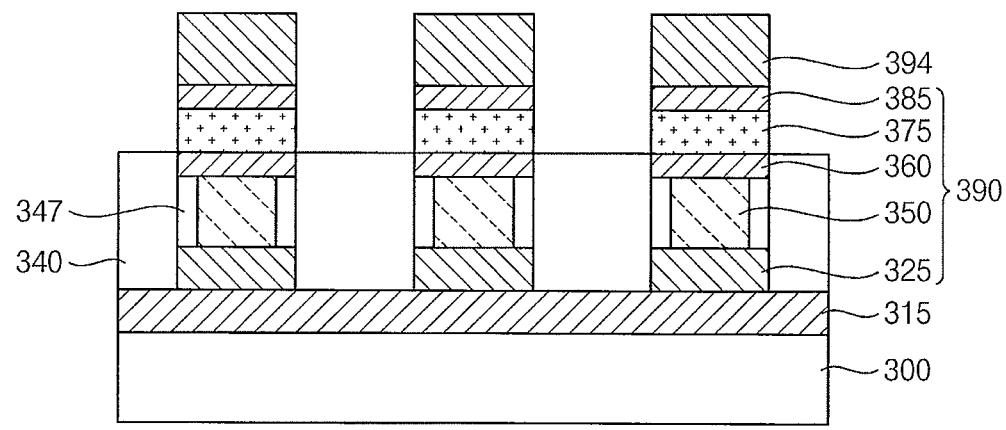
Figure 37:
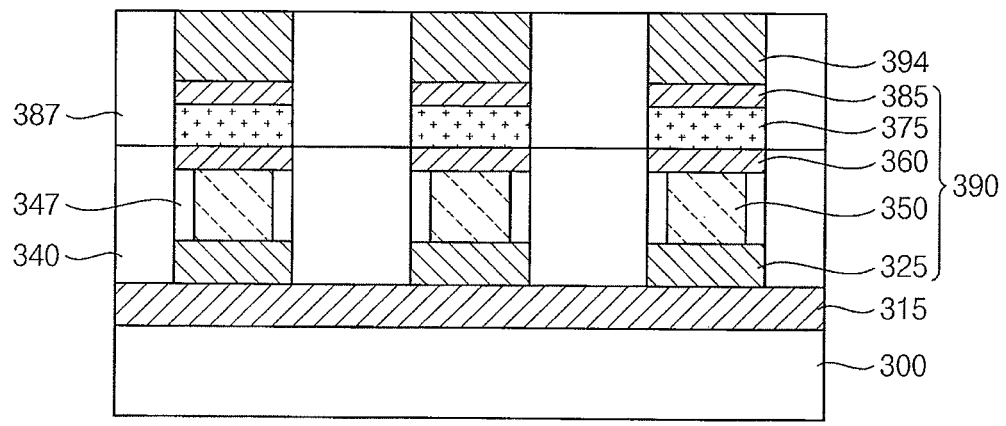

For example, FIGS. 28 to 35 are cross-sectional views of the variable resistance memory device taken along the first direction, and FIGS. 36 and 37 are cross-sectional views taken along the second direction.

The method may include processes substantially the same as or similar to those illustrated with reference to FIGS. 9 to 12 or FIGS. 17 to 23, and detailed descriptions thereon may be omitted below in the interest of brevity.

Figure 28:
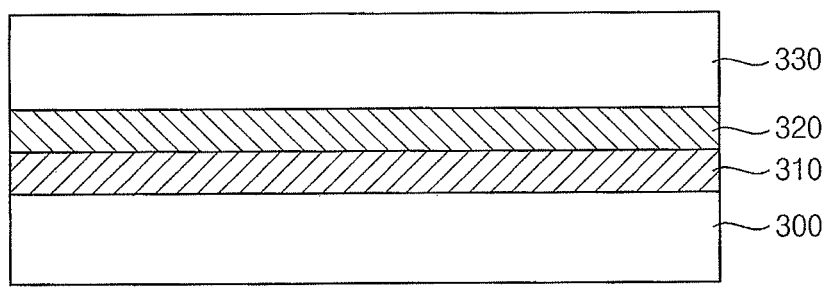
FIGS. 28 to 37 illustrate cross-sectional views of stages in a method of manufacturing a variable resistance memory device, e.g., the variable resistance memory device of FIGS. 26 and 27, in accordance with example embodiments.

Referring to FIG. 28, a first conductive layer 310, a first lower electrode layer 320, and a sacrificial layer 330 may be sequentially formed on a substrate 300. In example embodiments, the lower electrode layer 320 may be formed of a metal or a metal nitride, e.g., metallic titanium or titanium nitride.

Figure 29:
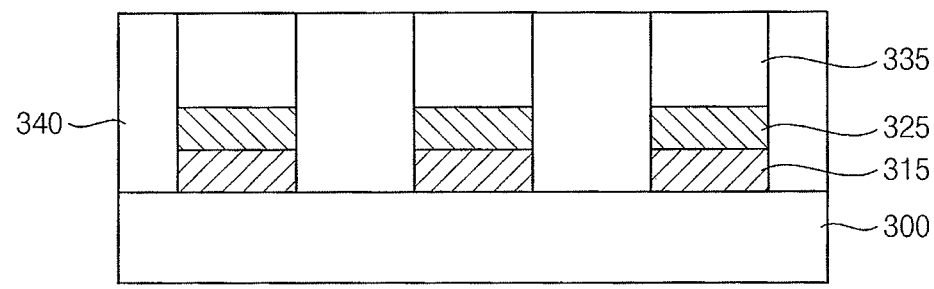

Referring to FIG. 29, processes substantially the same as or similar to those illustrated with reference to FIG. 18 may be performed. Thus, first conductive lines 315 each extending in the second direction may be formed, and a plurality of pillar structures each including a lower electrode 325 and a sacrificial pattern 335 may be formed. A first insulation layer 340 may be formed to surround sidewalls of the pillar structures and the first conductive lines 315.

Figure 30:
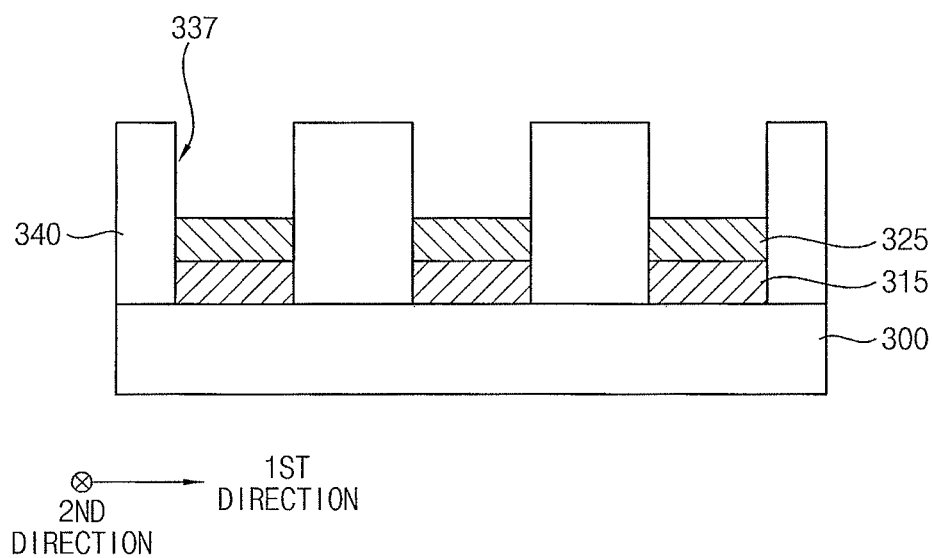

Referring to FIG. 30, the sacrificial pattern 335 may be removed from the pillar structure using an etching solution, e.g., phosphoric acid, and a first hole 337 may be formed to expose an upper surface of the lower electrode 325.

Figure 31:
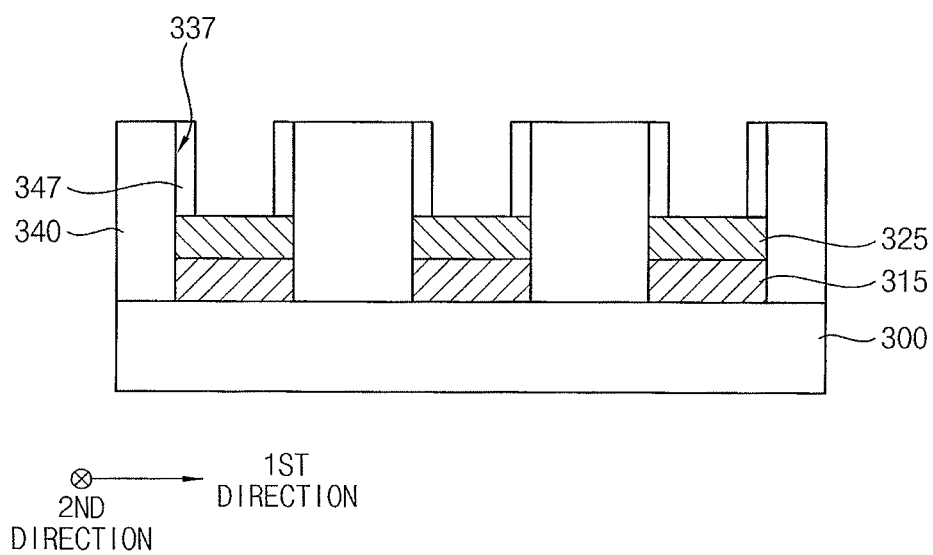

Referring to FIG. 31, processes substantially the same as or similar to those illustrated with reference to FIGS. 19 and 20 may be performed to form a first spacer 347 on a sidewall of the first hole 337.

Figure 32:
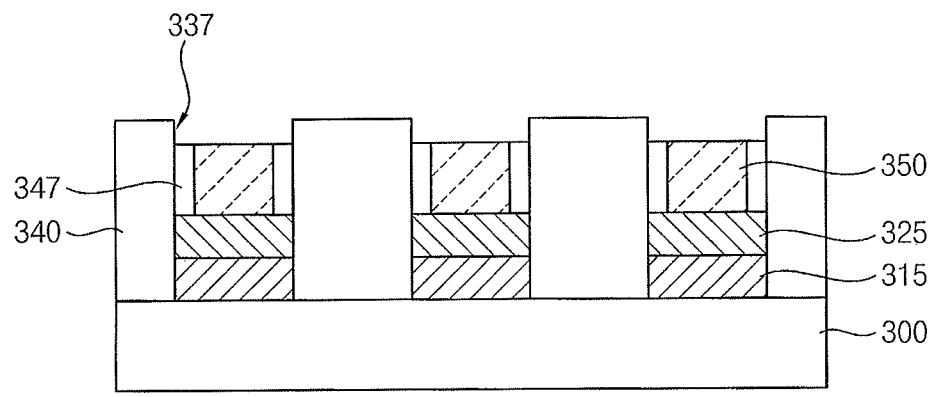

Referring to FIG. 32, processes substantially the same as or similar to those illustrated with reference to FIGS. 21 and 22 may be performed to form a variable resistance pattern 350 to fill a lower portion of the first hole 337.

Figure 33:
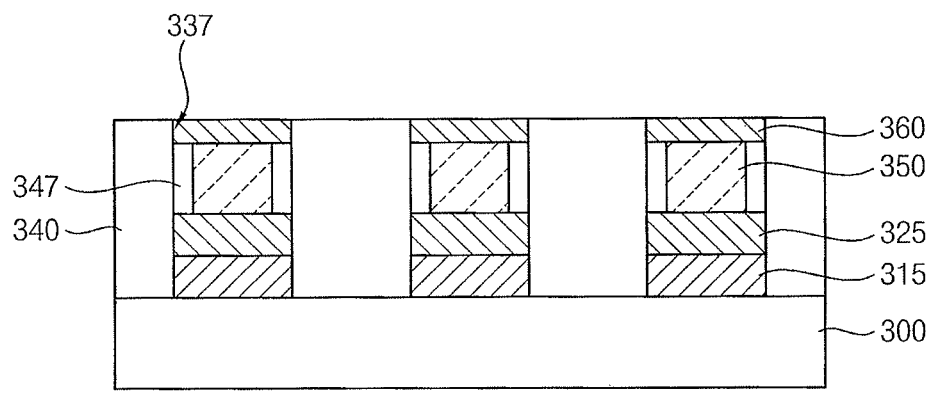

Referring to FIG. 33, processes substantially the same as or similar to those illustrated with reference to FIG. 23 may be performed to form an intermediate electrode 360 filling a remaining portion of the first hole 337 and covering upper surfaces of the variable resistance pattern 350 and the spacer 347.

As illustrated above, the variable resistance pattern 350 may be formed to have a reduced width and/or area by the spacer 347 through the damascene process. The intermediate electrode 360 may be self-aligned with the first hole 337.

Referring to FIG. 34, a selection material layer 370 and an upper electrode layer 380 may be sequentially formed on the insulation layer 340 and the intermediate electrode 360.

In example embodiments, the upper electrode layer 380 may be formed of the n-type semiconductor material or the high work function conductive material.

Referring to FIG. 35, each of the upper electrode layer 380 and the selection material layer 370 may be etched along the second direction to form a line pattern. A second insulation layer 384 may be formed on the first insulation layer 340 between the line patterns to extend in the second direction.

A second conductive layer 392 may be formed on the second insulation layer 384 and the upper electrode layer 380.

Referring to FIG. 36, the second conductive layer 392 may be etched along the first direction to form a plurality of second conductive lines 394. The upper electrode layer 380 and the selection material layer 370 may be etched along the first direction to form an upper electrode 385 and a selection pattern 375, respectively.

Thus, a memory cell 390 including the lower electrode 325, the variable resistance pattern 350, the intermediate electrode 360, the selection pattern 375 and the upper electrode 385 sequentially stacked may be formed at each area where the first and second conductive lines 315 and 394 overlap with each other in the vertical direction.

Referring to FIG. 37, a third insulation layer 387 may be formed on the first insulation layer 340 between neighboring ones of the memory cells 390 and between neighboring ones of the second conductive lines 394 to extend in the first direction. The third insulation layer 387 may cross and be merged with the second insulation layer 384.

Figure 38:
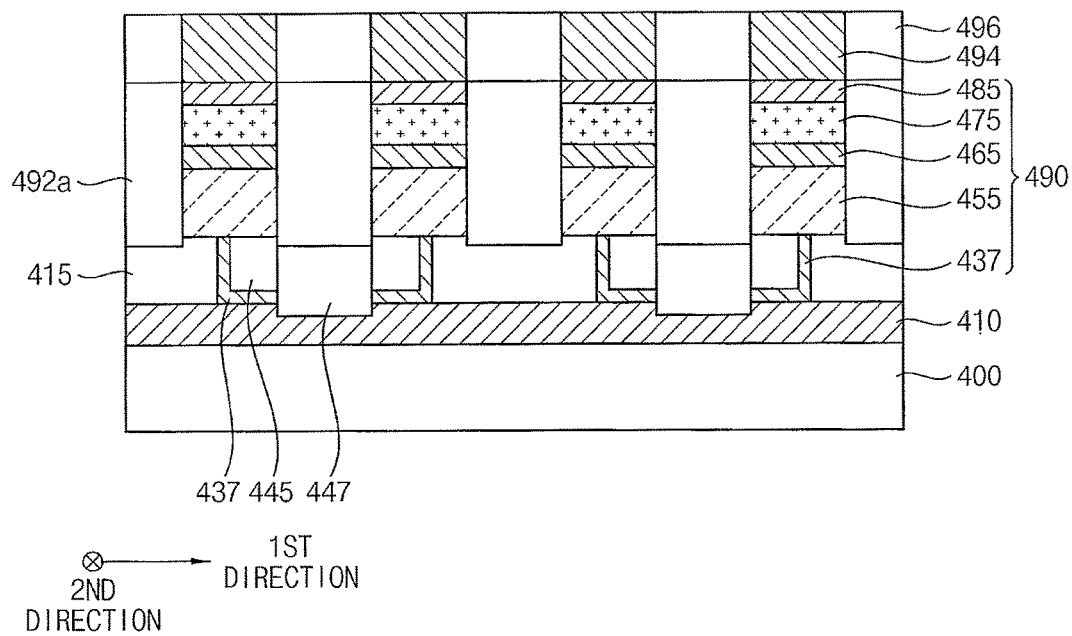
FIGS. 38 and 39 illustrate cross-sectional views of a variable resistance memory device in accordance with example embodiments.
Figure 39:
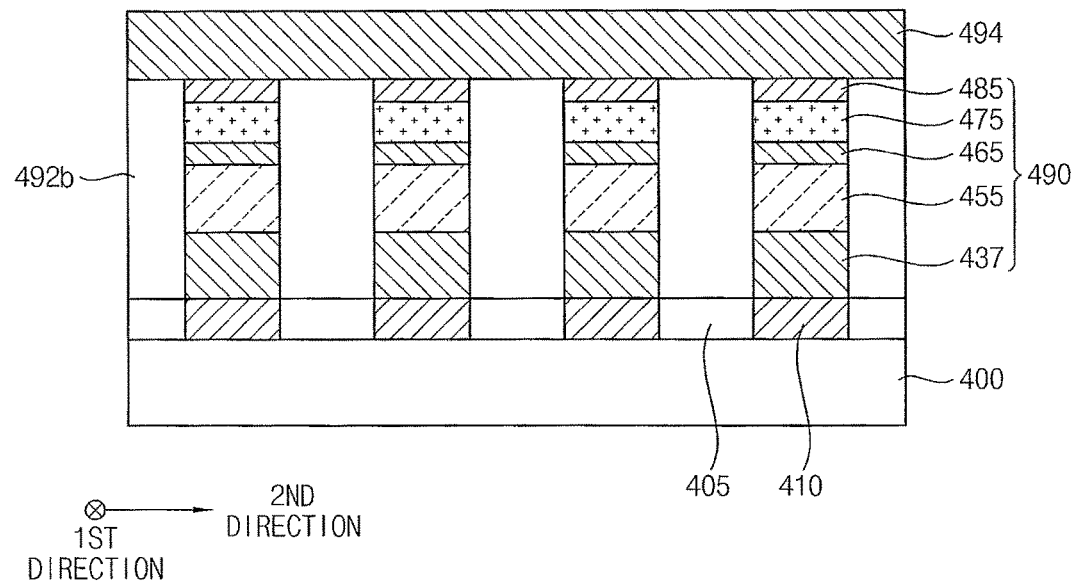

FIGS. 38 and 39 illustrate cross-sectional views of a variable resistance memory device in accordance with example embodiments. For example, FIG. 38 is a cross-sectional view of the variable resistance memory device taken along the first direction, and FIG. 39 is a cross-sectional view taken along the second direction.

The variable resistance memory device may include elements substantially the same as or similar to those of the variable resistance memory device illustrated with reference to FIGS. 6 to 8 or FIGS. 13 and 14. Thus, detailed descriptions on the common elements may be omitted below in the interest of brevity.

Referring to FIGS. 38 and 39, as illustrated with reference to FIGS. 6 to 8, a first conductive line 410 and a second conductive line 494 may be spaced apart from each other and may cross each other in the vertical direction. The first conductive line 410 may extend in the first direction, and a plurality of first conductive lines 410 may be spaced apart from each other in the second direction. The second conductive line 494 may extend in the second direction, and a plurality of second conductive lines 494 may be spaced apart from each other in the first direction. The first conductive lines 410 may be insulated from each other by a first insulation pattern 405. The second conductive lines 494 may be insulated from each other by a second insulation pattern 496.

A memory cell 490 may be formed at each area where the first and second conductive lines 410 and 494 overlap with each other in the vertical direction. In example embodiments, the memory cell 490 may have a structure that is reverse to that of the memory cell 290 of the variable resistance memory device shown in FIGS. 6 to 8. In the memory cell 290, the selection pattern may overlie the variable resistance pattern, e.g., a distance from the substrate to the selection pattern may be greater than a distance from the substrate to the variable resistance pattern.

The memory cell 490 may include a lower electrode 437, a variable resistance pattern 455, an intermediate electrode 465, a selection pattern 475, and an upper electrode 485 sequentially stacked on the first conductive line 410.

In example embodiments, the upper electrode 485 may include the n-type semiconductor material or the high work function conductive material. Thus, a P-N junction or a Schottky barrier may be formed between the upper electrode 485 and the selection pattern 475, so that the off-current in the selection pattern 475 or the memory cell 490 may be reduced.

In example embodiments, as illustrated with reference to FIG. 4, a barrier pattern may be between the selection pattern 475 and the upper electrode 485. In this case, the upper electrode 485 may include metallic titanium or titanium nitride, and the barrier pattern may include the n-type semiconductor material or the high work function conductive material.

In an example embodiment, the lower electrode 437 may have a bent shape. For example, the lower electrode 437 may include a horizontal portion and a vertical portion. The vertical portion of the lower electrode 437 may partially contact a lower or substrate-facing surface of the variable resistance pattern 455. The horizontal portion of the lower electrode 437 may have a tile or flat shape contacting an upper surface of the first conductive line 410.

The lower electrode 437 may have the bent shape so that the contact area between the lower electrode 437 and the variable resistance pattern 455 may be reduced. Thus, the efficiency of heating may be enhanced.

The lower electrode 437 may be buried in a lower insulation layer 415. As shown in FIG. 38, a pair of lower electrodes 437 may be symmetrical to each other around a filling insulation pattern 447. A spacer 445 may be between the lower electrode 437 and the filling insulation pattern 447 under the variable resistance pattern 455.

First and second insulation layers 492a and 492b may be on the filling insulation pattern 447 and the first insulation pattern 405, and the memory cells 490 may be divided or insulated from each other by the first and second insulation layers 492a and 492b.

The lower insulation layer 415, the filling insulation pattern 447, the first and second insulation layers 492a and 492b, and the first and second insulation patterns 405 and 496 may include, e.g., silicon oxide. The spacer 445 may include, e.g., silicon nitride or silicon oxynitride.

FIGS. 40A and 40B to 46A and 46B illustrate cross-sectional views of stages in a method of manufacturing a variable resistance memory device, e.g., the variable resistance memory device shown in FIGS. 38 to 39, in accordance with example embodiments.

Figure 40A:
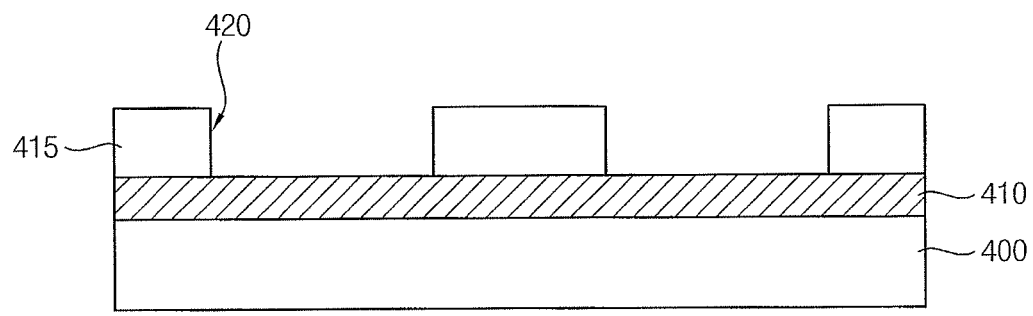
Figure 40B:
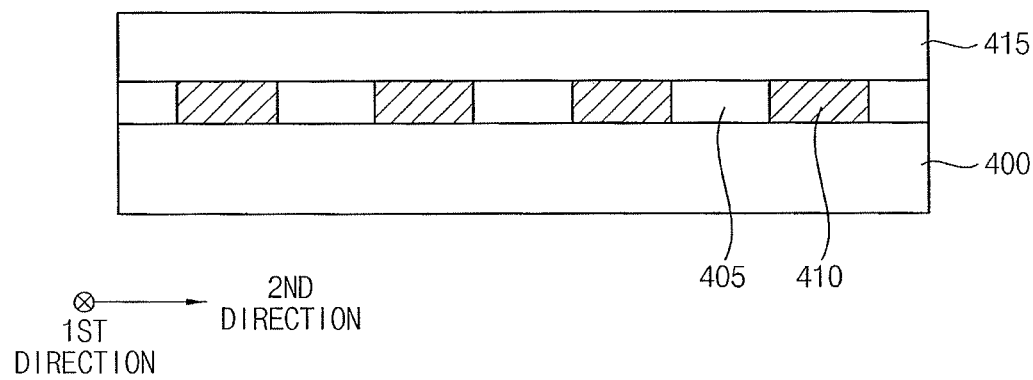
Figure 43:
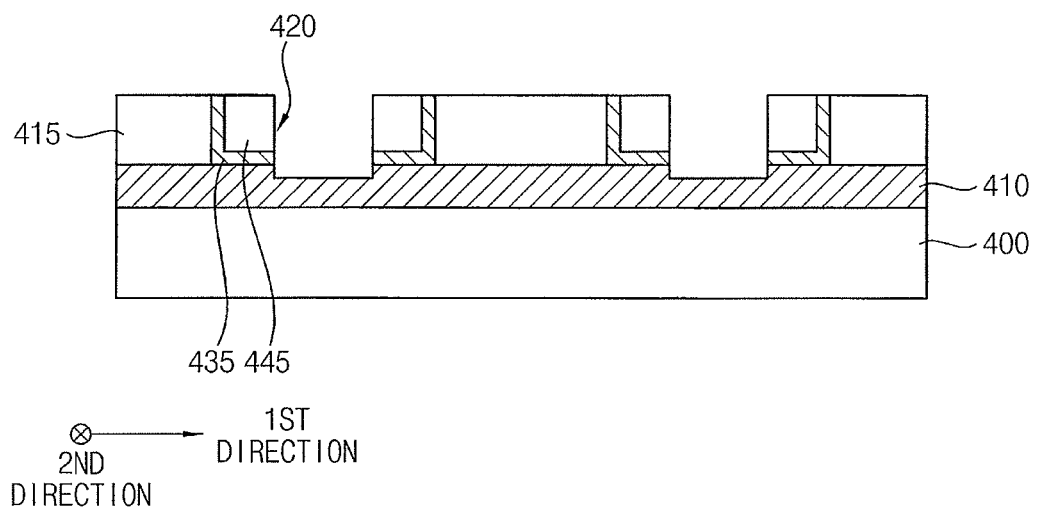
Figure 44:
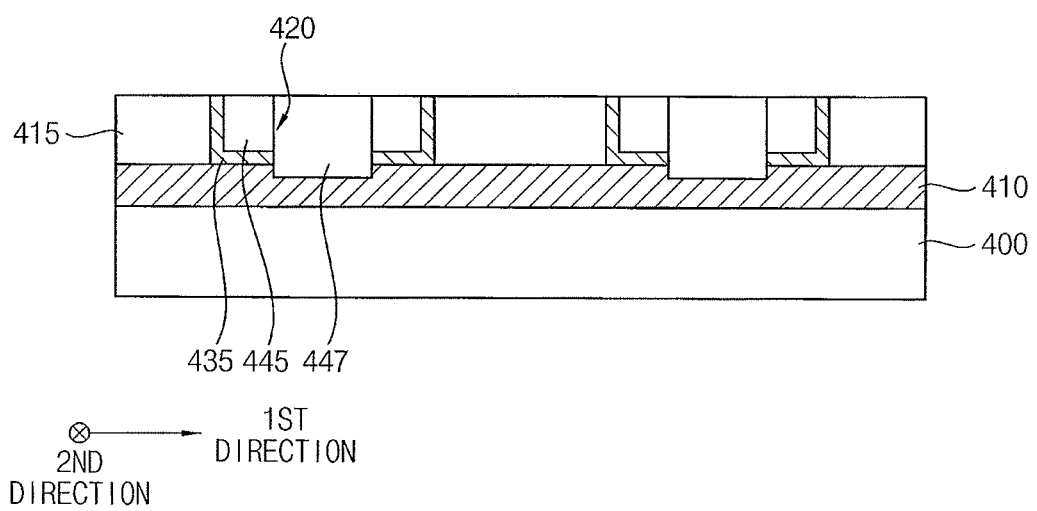
Figure 45A:
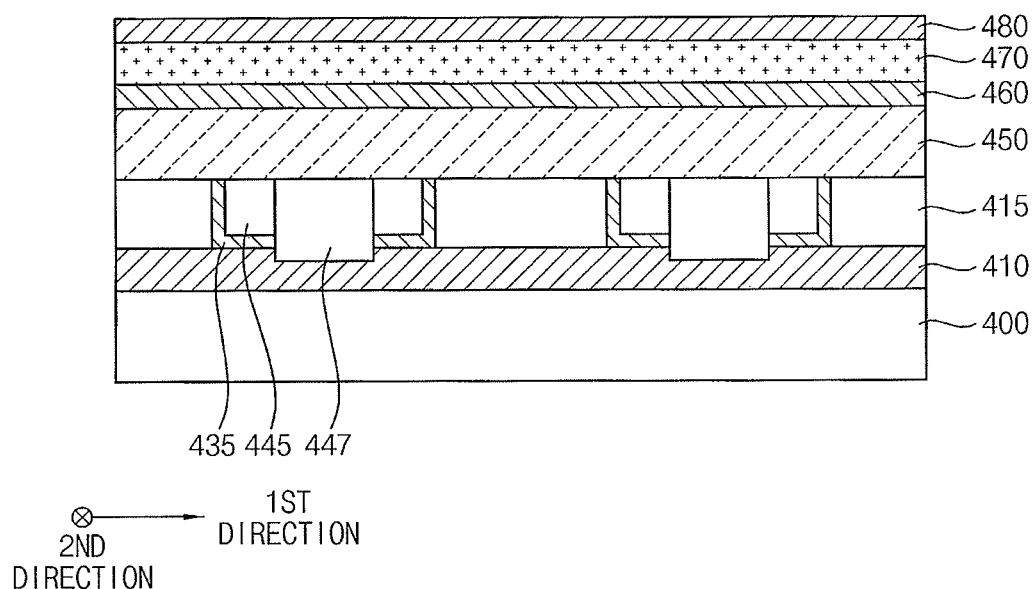
Figure 45B:
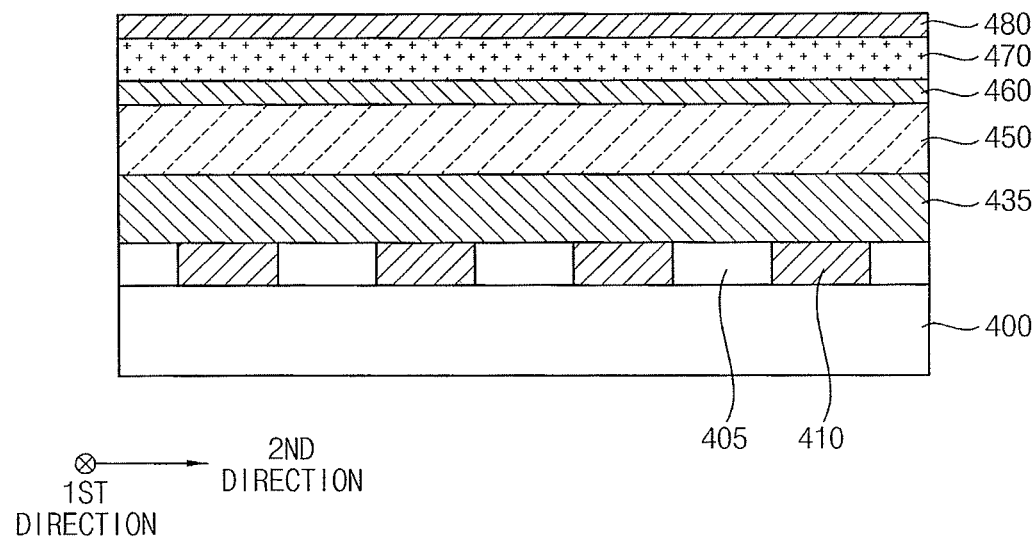
Figure 46A:
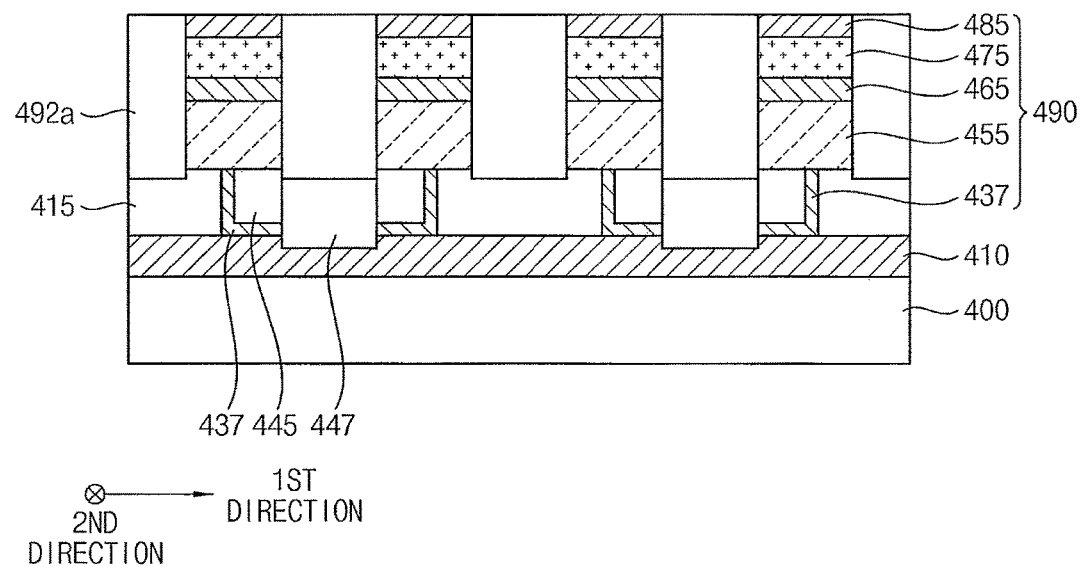
Figure 46B:
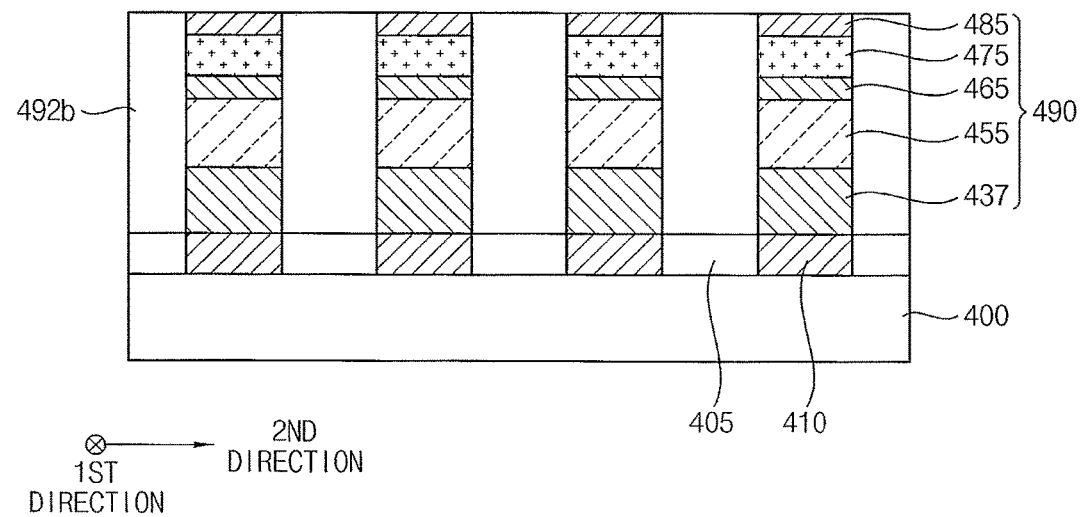

For example, FIGS. 40A, 41-44, 45A, and 46A are cross-sectional views taken along the first direction, and FIGS. 40B, 45B, and 46B are cross-sectional views taken along the second direction.

Referring to FIGS. 40A and 40B, a first conductive line 410 and a first insulation pattern 405 may be formed on a substrate 400, and a lower insulation layer 415 may be formed on the first conductive line 410 and the first insulation pattern 405.

In example embodiments, a first conductive layer may be formed on the substrate 400, and may be etched along the first direction to form a plurality of first conductive lines 410. The first insulation pattern 405 may fill spaces between the first conductive lines 410.

The lower insulation layer 415 may be etched to form an opening 420. The opening 420 may extend in the second direction, and may expose upper surfaces of the first conductive line 410 and the first insulation pattern 405.

Figure 41:
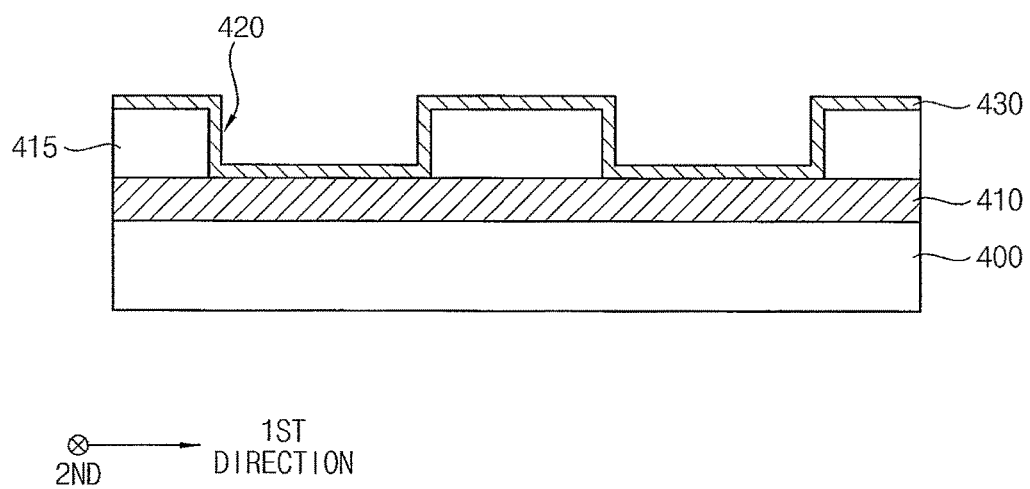

Referring to FIG. 41, a lower electrode layer 430 may be conformally formed on the exposed upper surfaces of the first conductive line 410 and the first insulation pattern 405, a sidewall of the opening 420, and an upper surface of the lower insulation layer 415. The lower electrode layer 430 may be formed of a metal or a metal nitride, e.g., metallic titanium or titanium nitride by an ALD process or a sputtering process.

Figure 42:
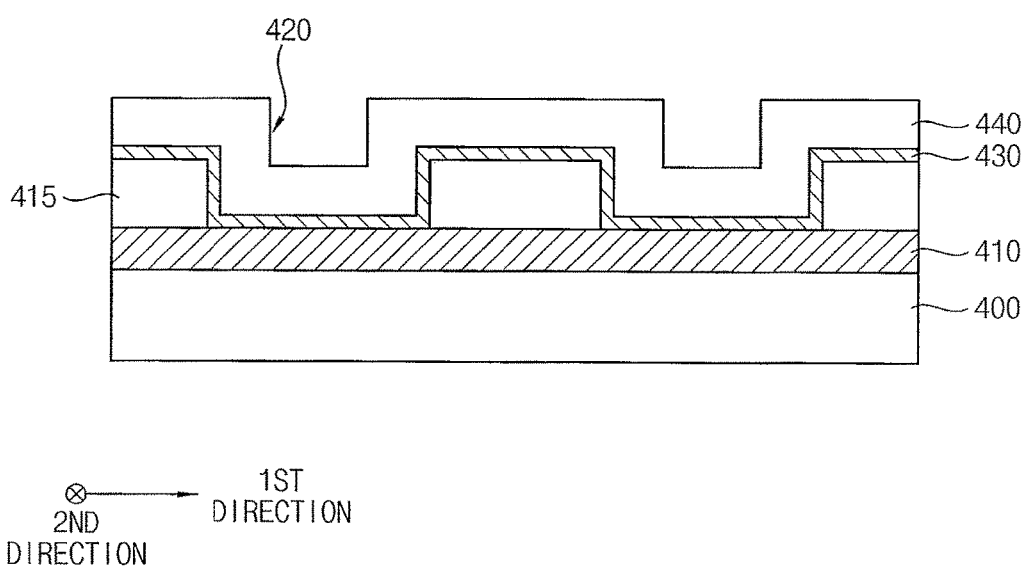

Referring to FIG. 42, a spacer layer 440 may be formed on the lower electrode layer 430 to partially fill the opening 420.

For example, the spacer layer 440 may be formed of, e.g., silicon oxide or silicon oxynitride by a CVD process or an ALD process.

Referring to FIG. 43, the spacer layer 440 and the lower electrode layer 430 may be partially removed to form a spacer 445 and a preliminary lower electrode 435, respectively.

In example embodiments, the spacer layer 440 and the lower electrode layer 430 may be planarized until an upper surface of the lower insulation layer 415 may be exposed by a CMP process. Portions of the spacer layer 440 and the lower electrode layer 430 on a bottom of the opening 420 may be removed.

Thus, the preliminary lower electrode 435 having a bent shape may be formed to extend in the second direction, and the spacer 445 may be formed on the preliminary lower electrode 435.

In an example embodiment, a pair of preliminary lower electrodes 435 and a pair of spacers 445 may face each other adjacent the opening 420.

Referring to FIG. 44, a filling insulation pattern 447 may be formed of, e.g., silicon oxide to fill the opening 420. For example, a filling insulation layer may be formed on the lower insulation layer 415 to fill the opening 420, and may be planarized until an upper surface of the spacer 445 or the preliminary lower electrode 435 may be exposed by a CMP process.

Referring to FIGS. 45A and 45B, a variable resistance material layer 450, an intermediate electrode layer 460, a selection material layer 470, and an upper electrode layer 480 may be sequentially formed on the lower insulation layer 415, the spacer 445, and the filling insulation pattern 447.

In example embodiments, the upper electrode layer 480 may be formed of the n-type semiconductor material or the high work function conductive material.

Referring to FIGS. 46A and 46B, the upper electrode layer 480, the selection material layer 470, the intermediate electrode layer 460, the variable resistance material layer 450, and the preliminary lower electrode 435 may be sequentially etched along the first and second directions.

The etching process along the second direction may be performed until an upper surface of the filling insulation pattern 447 may be exposed. By the etching process along the second direction, upper portions of the lower insulation layer 415 and the filling insulation pattern 447 may be partially etched.

After the etching process along the second direction, a first insulation layer 492a may be formed on the lower insulation layer 415 and the filling insulation pattern 447.

The etching process along the first direction may be performed until an upper surface of the first insulation pattern 405 is exposed. After the etching process along the first direction, a second insulation layer 492b may be formed on the first insulation pattern 405. The first and second insulation layers 492a and 492b may be merged with each other.

By the etching process, the preliminary lower electrode 435 may be cut by the unit of memory cell along the second direction to form a lower electrode 437. A variable resistance pattern 455, an intermediate electrode 465, a selection pattern 475, and an upper electrode 485 may be sequentially stacked on the lower electrode 437.

Thus, a memory cell 490 including the lower electrode 437, the variable resistance pattern 455, the intermediate electrode 465, the selection pattern 475 and the upper electrode 485 sequentially stacked may be formed.

Referring to FIGS. 38 and 39 again, a plurality of second conductive lines 494 (each of which extending in the second direction on the plurality of upper electrode 485) may be formed in the first direction. A second insulation pattern 496 may be formed of, e.g., silicon oxide on the first insulation layer 492a to fill spaces between the second conductive lines 494.

Figure 47:
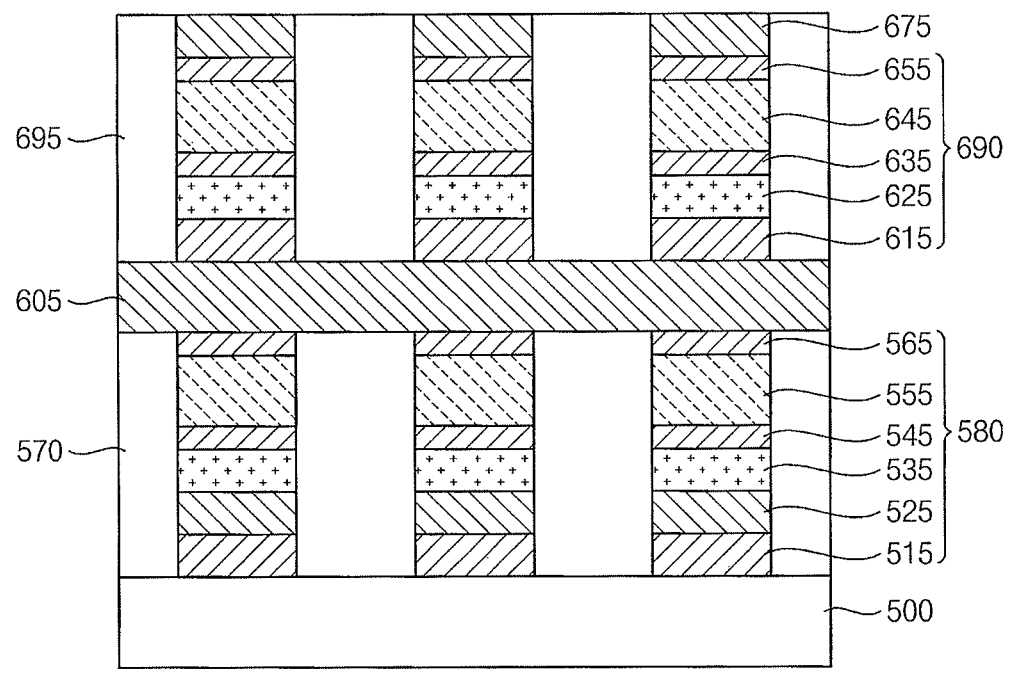
FIGS. 47 and 48 illustrate cross-sectional views of a variable resistance memory device in accordance with example embodiments.
Figure 48:
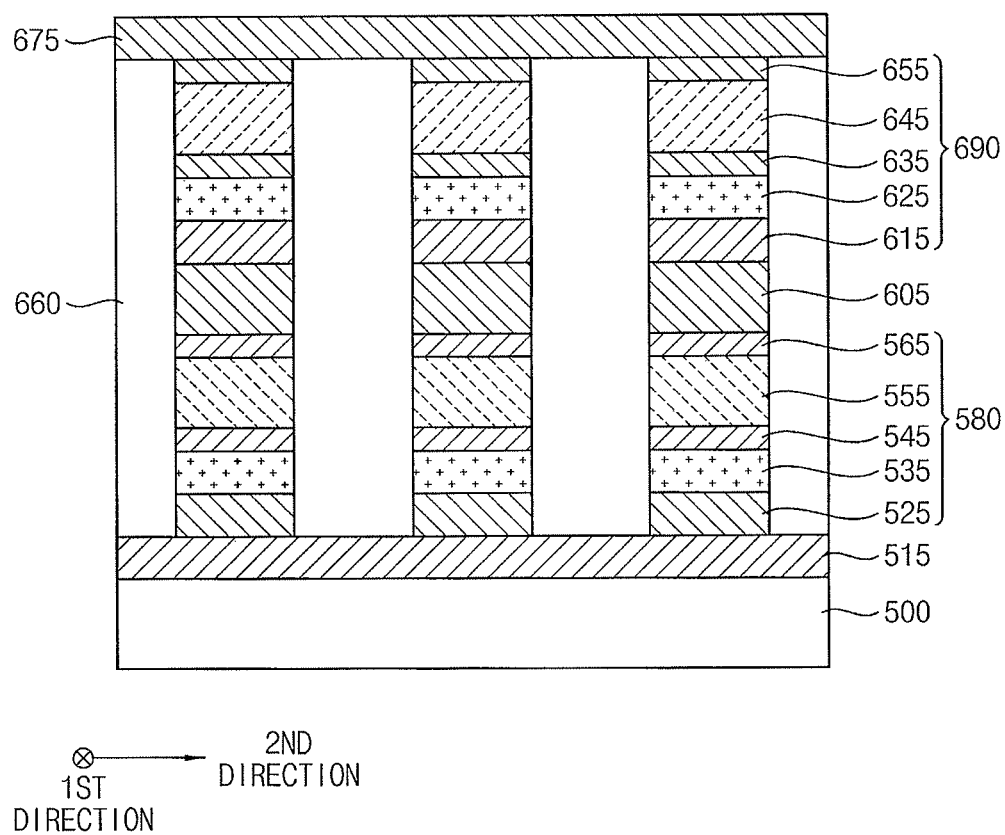

FIGS. 47 and 48 illustrate cross-sectional views of a variable resistance memory device in accordance with example embodiments. For example, FIG. 47 is a cross-sectional view taken along the first direction, and FIG. 48 is a cross-sectional view taken along the second direction.

The variable resistance memory device may include elements substantially the same as or similar to those of FIGS. 6 to 8, and thus detailed descriptions thereon may be omitted herein.

FIGS. 47 and 48 show a variable resistance memory device having a stacked structure of a cross-point cell array in which memory cells are disposed at respective areas where conductive lines overlaps with each other in the third direction. FIGS. 47 and 48 show that the variable resistance memory device may have a stacked structure in which the memory cells are stacked in two levels. In an implementation, the variable resistance memory device may have a stacked structure in which the memory cells are stacked in more than two levels.

Referring to FIGS. 47 and 48, the variable resistance memory device may include a first conductive line 515, a second conductive line 605, and a third conductive line 675 spaced apart from each other in the vertical direction. A first memory cell 580 may be disposed at each area where the first and second conductive lines 515 and 605 overlap with each other in the vertical direction, and a second memory cell 690 may be disposed at each area where the second and third conductive lines 605 and 675 overlap with each other in the vertical direction.

In example embodiments, the first and third conductive lines 515 and 675 may serve as word lines of the variable resistance memory device, and the second conductive line 605 may serve as a bit line of the variable resistance memory device. In an implementation, the first and third conductive lines 515 and 675 may serve as bit lines of the variable resistance memory device, and the second conductive line 605 may serve as a word line of the variable resistance memory device.

The first conductive line 515 may extend in the second direction on the substrate 500, and a plurality of first conductive lines 515 may be spaced apart from each other in the first direction.

The second conductive line 605 may be disposed over the first conductive line 515 and spaced apart from the first conductive line 515 in the vertical direction. The second conductive line 605 may extend in the first direction, and a plurality of second conductive lines 605 may be spaced apart from each other in the second direction.

The third conductive line 675 may be disposed over the second conductive line 605 and spaced apart from the second conductive line 605 in the vertical direction. The third conductive line 675 may extend in the second direction, and a plurality of third conductive lines 675 may be spaced apart from each other in the first direction.

The first memory cell 580 may be formed between the first and second conductive lines 515 and 605, specifically, at each area where the first and second conductive lines 515 and 605 overlap with each other in the vertical direction. Thus, a plurality of first memory cells 580 may be formed in each of the first and second directions to define a first cross-point cell array.

For example, a plurality of first memory cells 580 disposed in the first direction may define a first memory cell row. Additionally, a plurality of first memory cells 580 disposed in the second direction may define a first memory cell column.

In example embodiments, the first memory cell 580 may include a first lower electrode 525, a first selection pattern 535, a first intermediate electrode 545, a first variable resistance pattern 555, and a first upper electrode 565 sequentially stacked on the first conductive line 515. In example embodiments, the first upper electrode 565 may not be formed but omitted.

The first lower electrode 525 may include the n-type semiconductor material or the high work function, and may form a P-N junction or a Schottky barrier together with the first selection pattern 535.

A first insulation pattern 570 may be formed between neighboring ones of the first memory cell columns in the first direction. For example, the first insulation pattern 570 may extend in the second direction between the first memory cell columns.

A second cross-point cell array including a plurality of second memory cells 690 may be formed over the first cross-point cell array. In example embodiments, the plurality of second memory cells 690 may be formed at respective areas where the second and third conductive lines 605 and 675 overlap with each other in the vertical direction.

For example, a plurality of second memory cells 690 disposed in the first direction may define a second memory cell row. Additionally, a plurality of second memory cells 690 disposed in the second direction may define a second memory cell column.

In example embodiments, the second memory cell 690 may include a second lower electrode 615, a second selection pattern 625, a second intermediate electrode 635, a second variable resistance pattern 645 and a second upper electrode 655 sequentially stacked on the second conductive line 605. In example embodiments, the second upper electrode 655 may be omitted.

The second lower electrode 615 may include the n-type semiconductor material or the high work function, and may form a P-N junction or a Schottky barrier together with the second selection pattern 625.

As illustrated in FIG. 47, a third insulation pattern 695 may be formed between neighboring ones of the second memory cell columns in the first direction. For example, the third insulation pattern 695 may extend in the second direction between the first memory cell columns.

In an example embodiment, as shown in FIGS. 47 and 48, one of the first memory cell rows and one of the second memory cell rows may share one of the second conductive lines 605. The first and second memory cell rows sharing the second conductive line 605 may define a memory cell row.

A second insulation pattern 660 may be formed between neighboring ones of the memory cell rows. In an example embodiment, the second insulation pattern 660 may penetrate through the first and second cross-point cell arrays, and may extend in the first direction. The second insulation pattern 660 may penetrate through the second conductive lines 605.

The second insulation pattern 660 may be merged with the first and second insulation patterns 570 and 695. A sidewall of the first memory cell 580 may be surrounded by the first and second insulation patterns 570 and 690, and a sidewall of the second memory cell 690 may be surrounded by the second and third insulation patterns 660 and 695.

FIGS. 47 and 48 show the stacked structure of the cross-point cell arrays each of which may include memory cells substantially the same as or similar to those illustrated with reference to FIG. 1 or FIGS. 6 to 8. However, the memory cells may be also substantially the same as or similar to those illustrated with reference to FIGS. 2 to 4, FIGS. 13 and 14, FIGS. 15 and 16, FIGS. 24 and 25, FIGS. 26 and 27, or FIGS. 38 and 39.

FIG. 49 to FIGS. 53A and 53B illustrate cross-sectional views of stages in a method of manufacturing a variable resistance memory device, e.g., the variable resistance memory device shown in FIGS. 47 and 48, in accordance with example embodiments.

Figure 50:
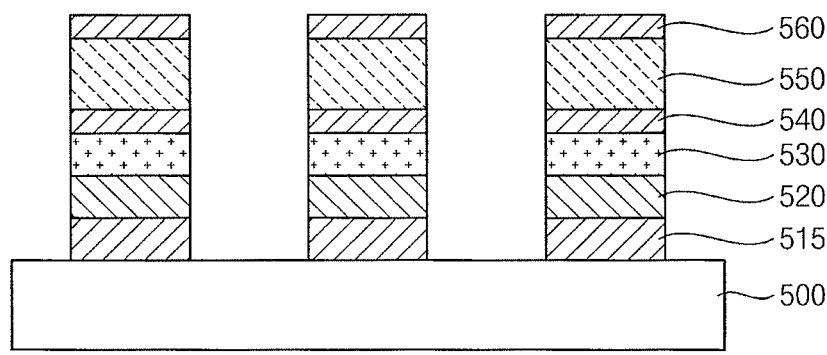
Figure 51:
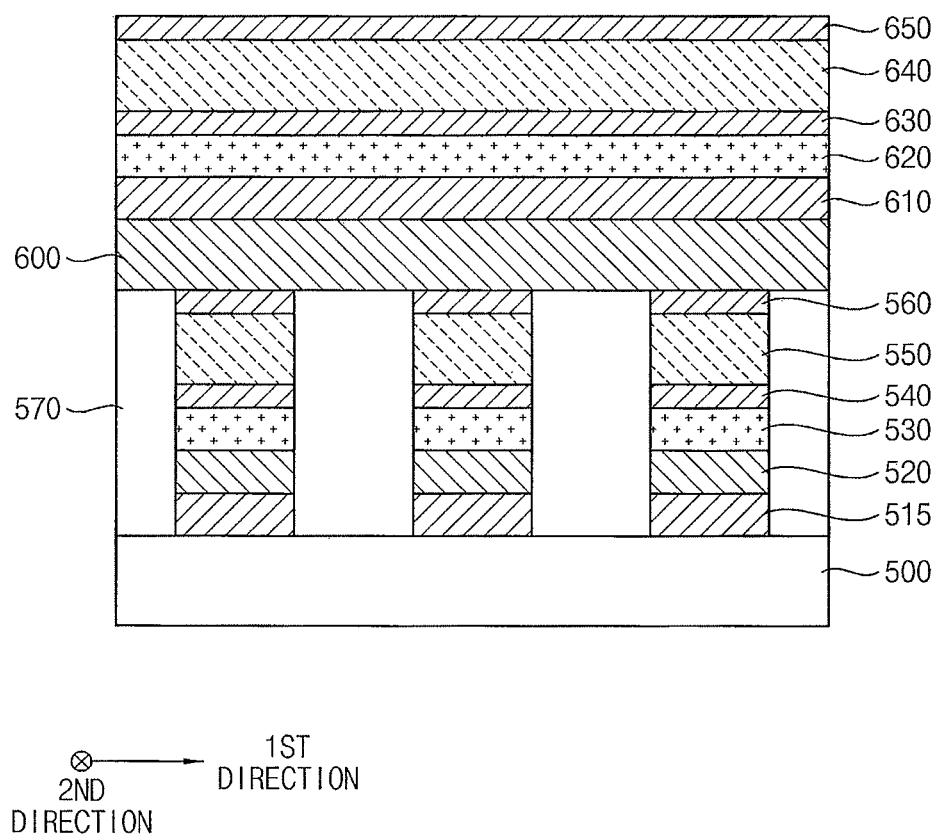
Figure 52:
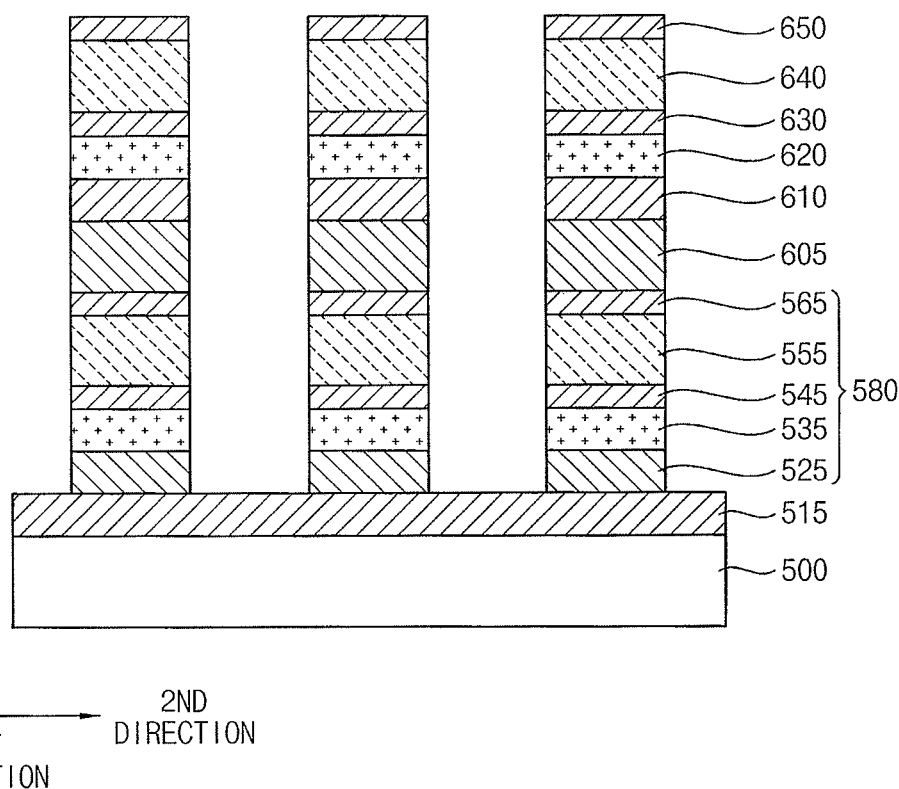
Figure 53A:
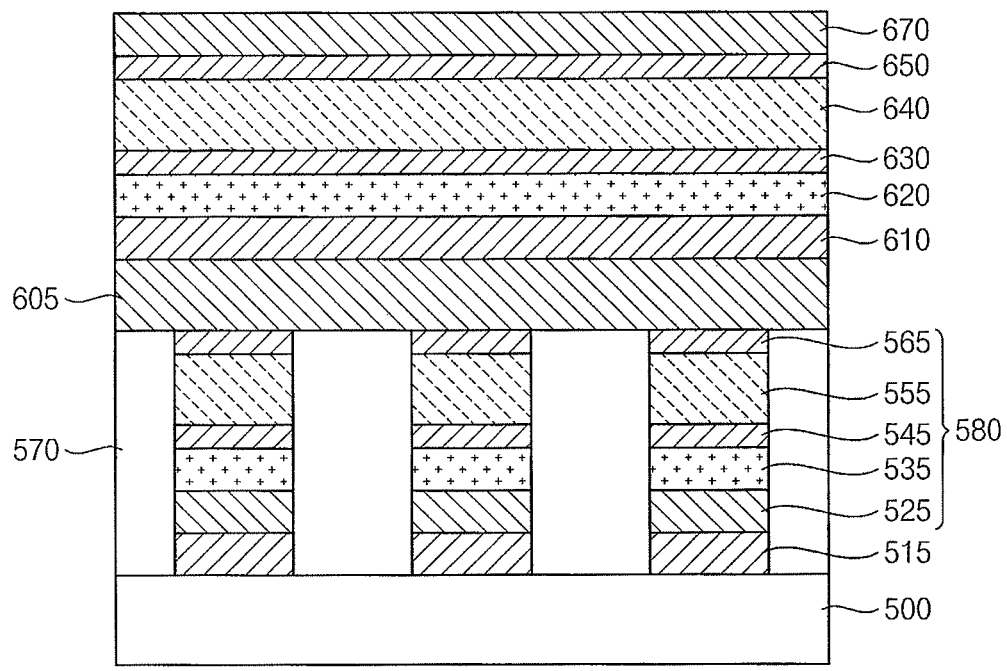
Figure 53B:
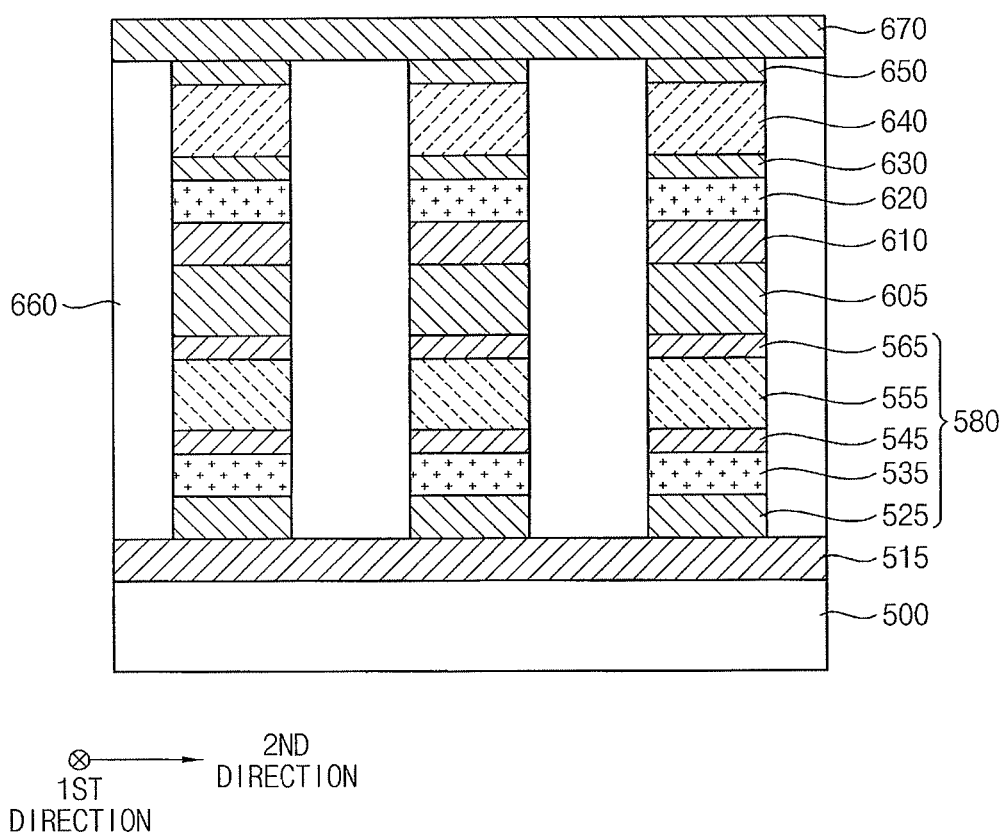

For example, FIGS. 49 to 51 and 53A are cross-sectional views taken along the first direction, and FIGS. 52 and 53B are cross-sectional views taken along a the second direction.

Figure 49:
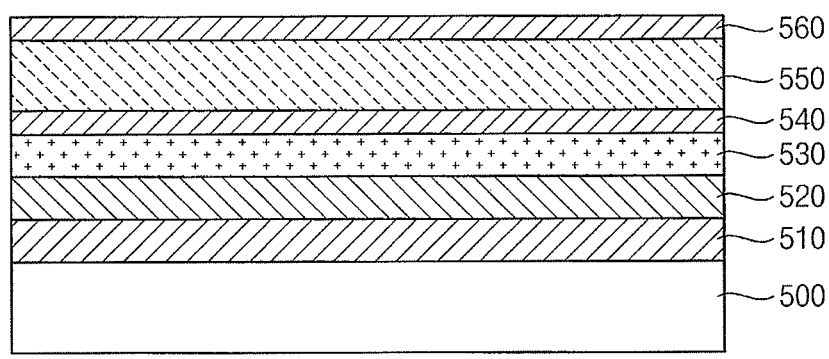

Referring to FIG. 49, a first conductive layer 510, a first lower electrode layer 520, a first selection material layer 530, a first intermediate electrode layer 540, a first variable resistance material layer 550, and a first upper electrode layer 560 may be sequentially formed on a substrate 500.

In example embodiments, the first lower electrode layer 520 may be formed of the n-type semiconductor material or the high work function conductive material.

Referring to FIG. 50, the first upper electrode layer 560, the first variable resistance material layer 550, the first intermediate electrode layer 540, the first selection material layer 530, the first lower electrode layer 520 and the first conductive layer 510 may be sequentially etched.

By the etching process, each of the first upper electrode layer 560, the first variable resistance material layer 550, the first intermediate electrode layer 540, the first selection material layer 530, and the first lower electrode layer 520 may be transformed into a line pattern extending in the second direction. Additionally, a plurality of first conductive lines 515 each extending in the second direction may be formed in the first direction from the first conductive layer 510.

Referring to FIG. 51, a first insulation pattern 570 may fill spaces between the first conductive line 515 and between the line patterns. A second conductive layer 600, a second lower electrode layer 610, a second selection material layer 620, a second intermediate electrode layer 630, a second variable resistance material layer 640 and a second upper electrode layer 650 may be sequentially formed on the first insulation pattern 570 and the second upper electrode layer 650.

In example embodiments, the second lower electrode layer 610 may be formed of the n-type semiconductor material or the high work function conductive material.

Referring to FIG. 52, the second upper electrode layer 650, the second variable resistance material layer 640, the second intermediate electrode layer 630, the second selection material layer 620, and the second lower electrode layer 610, the second conductive layer 600, the first upper electrode layer 560, the first variable resistance material layer 550, the first intermediate electrode layer 540, the first selection material layer 530 and the first lower electrode layer 520 may be sequentially etched in the first direction.

The etching process may be performed until an upper surface of the first conductive line 515 is exposed. In an example embodiment, by the etching process, an upper portion of the first conductive line 515 may be also etched.

As a result of the etching process, a plurality of second conductive lines 605 each extending in the first direction may be formed in the second direction from the second conductive line 600.

As a result of the etching process, a first memory cell 580 including a first lower electrode 525, a first selection pattern 535, a first intermediate electrode 545, a first variable resistance pattern 555 and a first upper electrode 565 sequentially stacked may be formed at each area where the first and second conductive lines 515 and 605 overlap with each other in the vertical direction.

As a result of the etching process, each of the second lower electrode layer 610, the second selection material layer 620, the second intermediate electrode layer 630, the second variable resistance material layer 640 and the second upper electrode layer 650 may be transformed into a line pattern extending in the first direction on the second conductive line 605.

Referring to FIGS. 53A and 53B, a second insulation pattern 660 may fill spaces between the first memory cells 580, between the second conductive lines 605 and between the line patterns. The second insulation pattern 660 may extend in the first direction. The second insulation pattern 660 may cross the first insulation pattern 570, and may be merged with the first insulation pattern 570.

A third insulation layer 670 may be formed on the second upper electrode layer 650 and the second insulation pattern 660.

Referring to FIGS. 47 and 48 again, the third conductive layer 670, the second upper electrode layer 650, the second variable resistance material layer 640, the second intermediate electrode layer 630, the second selection material layer 620, and the second lower electrode layer 610 may be sequentially etched along the second direction.

The etching process may be performed until an upper surface of the second conductive line 605 is exposed.

By the etching process, a plurality of third conductive lines 675 each extending in the second direction may be formed in the first direction from the third conductive layer 670. Additionally, a second memory cell 690 including a second lower electrode 615, a second selection pattern 625, a second intermediate electrode 635, a second variable resistance pattern 645, and a second upper electrode 655 sequentially stacked may be formed at each area where the second and third conductive lines 605 and 675 overlap with each other in the vertical direction.

A third insulation pattern 695 may be formed to fill spaces between the second memory cells 690 and between the third conductive lines 675. The third insulation pattern 695 may extend in the second direction. The third insulation pattern 695 may cross the second insulation pattern 660, and may be merged with the second insulation pattern 660.

Figure 54:
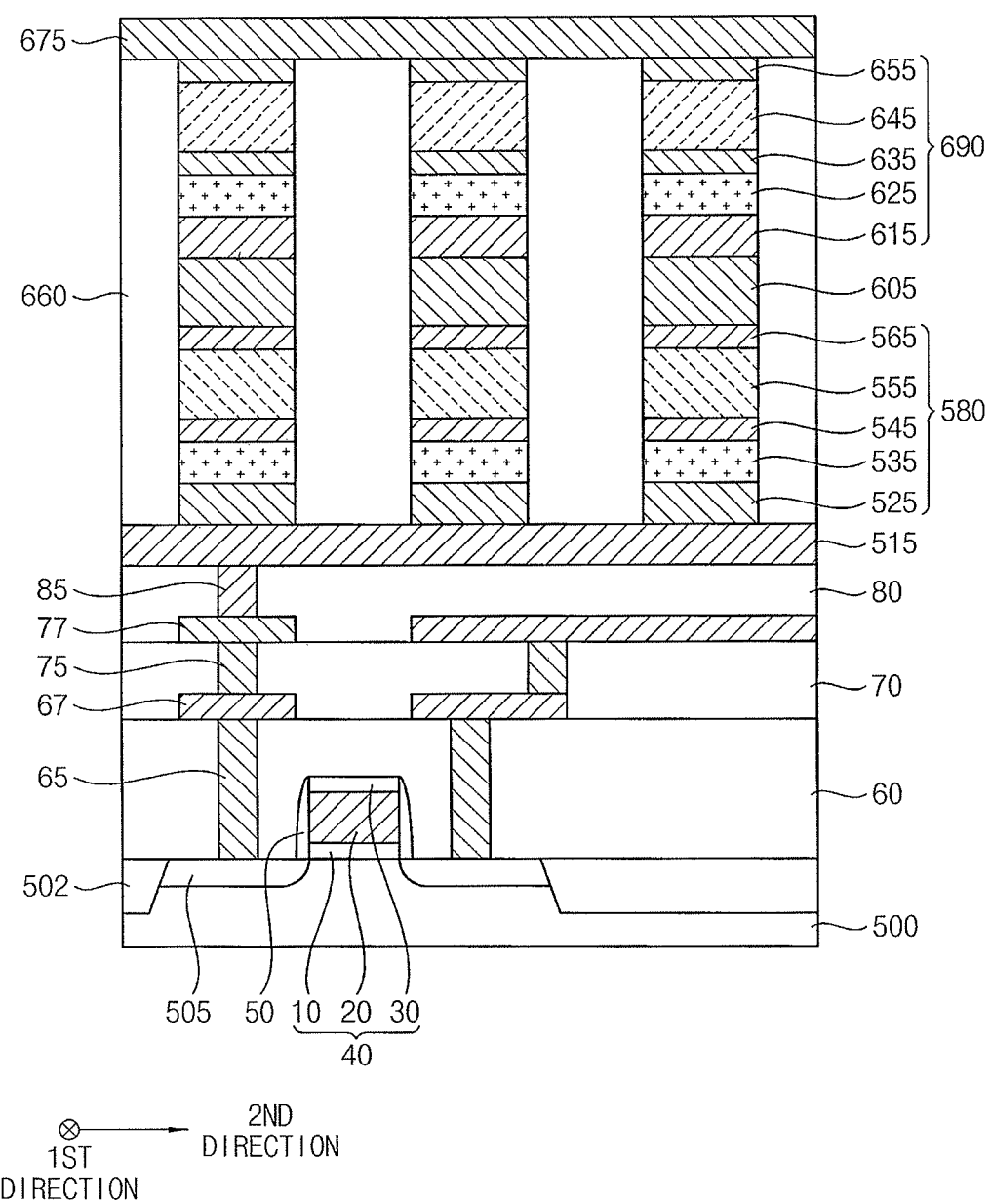
FIG. 54 illustrates a cross-sectional view of a variable resistance memory device in accordance with example embodiments.

FIG. 54 illustrates a cross-sectional view of a variable resistance memory device in accordance with example embodiments.

FIG. 54 shows a variable resistance memory device having a cell over peri (COP) structure in which peripheral circuits and memory cells are sequentially stacked.

Referring to FIG. 54, a peripheral circuit region may be defined by a gate structure 40, first to third insulating interlayers 60, 70 and 80, first to third contact plugs 65, 75 and 85, and first and second wirings 67 and 77 on the substrate 100. The cross-point cell array including the first conductive line 515, the second conductive line 605, the third conductive line 675, the first memory cells 580 and the second memory cells 690 as shown in FIGS. 47 and 48 may be stacked on the peripheral circuit region.

An isolation layer 502 may be formed on the substrate 500, and thus an active region and a field region may be defined in the substrate 500.

The gate structure 40 may include a gate insulation pattern 10, a gate electrode 20, and a gate mask 30 sequentially stacked.

The gate insulation pattern 10 may include, e.g., silicon oxide, a metal oxide, etc., the gate electrode 20 may include, e.g., doped polysilicon, a metal, a metal silicide, a metal nitride, etc., and the gate mask 30 may include, e.g., silicon nitride. In an example embodiment, a gate spacer 50 may be further formed on a sidewall of the gate structure 40.

An impurity region 505 may be formed at an upper portion of the substrate 500 adjacent the gate structure 40. The impurity region 505 may include n-type impurities, e.g., phosphorus, arsenic, etc. In this case, the gate structure 40 and the impurity region 505 may define an NMOS transistor, and the portion of the substrate 500 shown in FIG. 54 may serve as an NMOS region.

In an example embodiment, the substrate 500 may further include a PMOS region in which a PMOS transistor including a gate structure and an impurity region doped with p-type impurities may be formed. In this case, the variable resistance memory device may include a complementary metal oxide semiconductor (CMOS) transistor.

In an example embodiment, the gate structure 40 may be a buried gate structure of which a portion may be buried in the substrate 500. In this case, an upper portion of the substrate 500 may be removed to form a recess, and a gate insulation pattern and a gate electrode may be formed in the recess.

The first insulating interlayer 60 may cover the gate structure 40, the gate spacer 50 and the impurity region 505 on the substrate 500, and the first contact plug 65 may extend through the first insulating interlayer 60 to contact the impurity region 505. The first wiring 67 may be formed on the first insulating interlayer 60, and may be electrically connected to the first contact plug 65.

The second insulating interlayer 70 may be formed on the first insulating interlayer 60, and the second contact plug 75 may extend through the second insulating interlayer 70 to contact the first wiring 67. The second wiring 77 may be formed on the second insulating interlayer 70, and may be electrically connected to the second contact plug 75. In an example embodiment, a portion of the second wiring 77 may extend to the PMOS region, and may be electrically connected to the impurity region of the PMOS transistor.

The third insulating interlayer 80 may be formed on the second insulating interlayer 70, and may cover the second wiring 77. The third contact plug 85 may extend through the third insulating interlayer 80 to contact the second wiring 77.

The first to third insulating interlayers 60, 70 and 80 may include silicon oxide. The first to third contact plugs 65, 75 and 85, and the first and second wirings 67 and 77 may include a metal, e.g., tungsten, aluminum, copper, titanium, etc., and/or a metal nitride.

The cross-point cell array may be formed on the third insulating interlayer 80. For example, the first conductive line 515 may be electrically connected to the third contact plug 85.

FIG. 54 shows the first and second wirings 67 and 77 in respective two levels in the peripheral circuit region. For example, the wirings may be formed in a single level, or more wirings may be formed in more than two levels in the peripheral circuit region.

FIGS. 55 to 60 illustrate cross-sectional views of stages in a method of manufacturing a variable resistance memory device in accordance with example embodiments.

Figure 55:
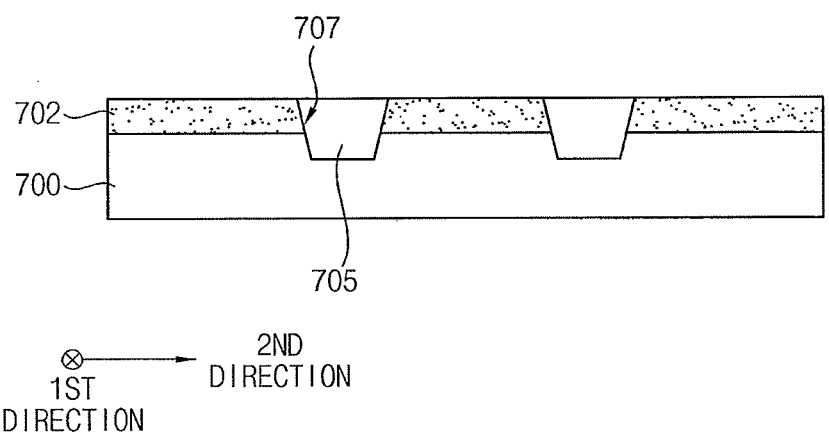
FIGS. 55 to 60 illustrate cross-sectional views of stages in a method of manufacturing a variable resistance memory device in accordance with example embodiments.

Referring to FIG. 55, impurities may be implanted into an upper portion of a substrate 700 to form an impurity region, and an isolation pattern 705 may be formed on the substrate 700 to define an active region and a field region. The impurity region may be divided by the isolation pattern 705 to form a plurality of first conductive lines 702.

The isolation pattern 705 may be formed by a shallow trench isolation (STI) process. For example, trenches 707 may be formed on the substrate 700, an isolation layer may be formed on the substrate 700 to fill the trenches 707, and may be planarized until an upper surface of the substrate 700 is exposed. The isolation layer may be formed of an insulation material, e.g., silicon oxide.

In example embodiments, the trench 707 may be formed to extend in the first direction, and a plurality of trenches 707 may be formed in the second direction. Thus, a first conductive line 702 and the isolation pattern 705 each extending in the first direction may be formed in the second direction.

In an example embodiment, after forming the isolation pattern 705 by the STI process, and then the first conductive lines 702 may be formed by an ion implantation process.

Figure 56:
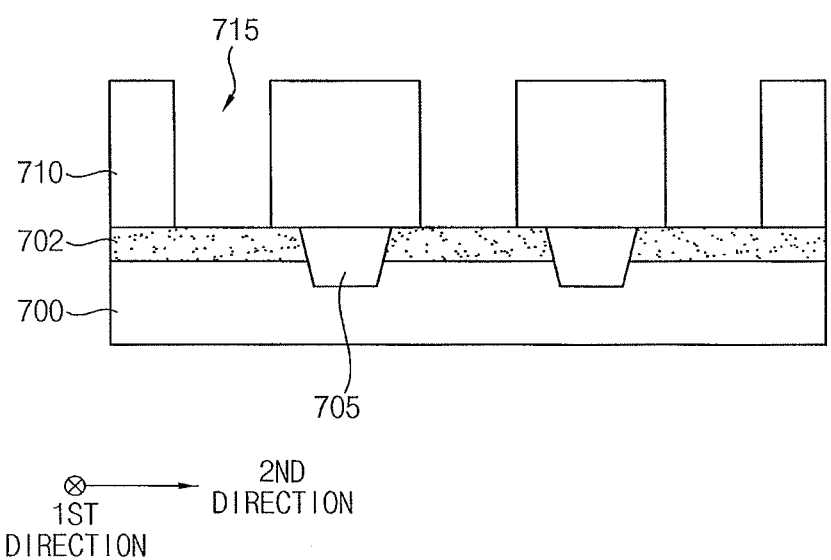

Referring to FIG. 56, a first insulating interlayer 710 may be formed on the first conductive line 702 and the isolation pattern 705, and may be partially etched to form a first opening 715.

For example, the first opening 715 may expose an upper surface of the first conductive line 702, and a plurality of first openings 715 may be formed in the first direction to define a first opening column.

Figure 57:
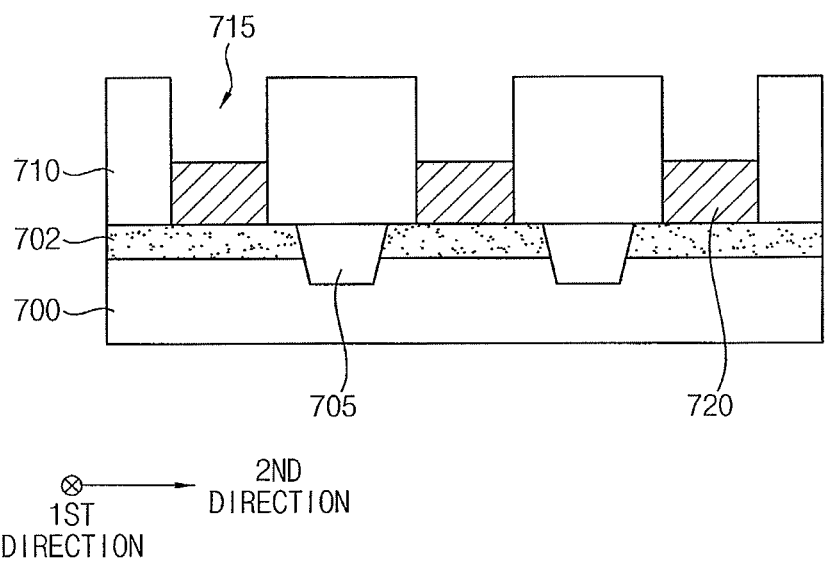

Referring to FIG. 57, a lower electrode 720 may be formed to fill a lower portion of the first opening 715.

In example embodiments, the lower electrode 720 may be formed by a selective epitaxial growth (SEG) process using the exposed upper surface of the first conductive line 702 as a seed. During the SEG process, n-type impurities may be also implanted. Thus, the lower electrode 720 may include n-type semiconductor material.

Figure 58:
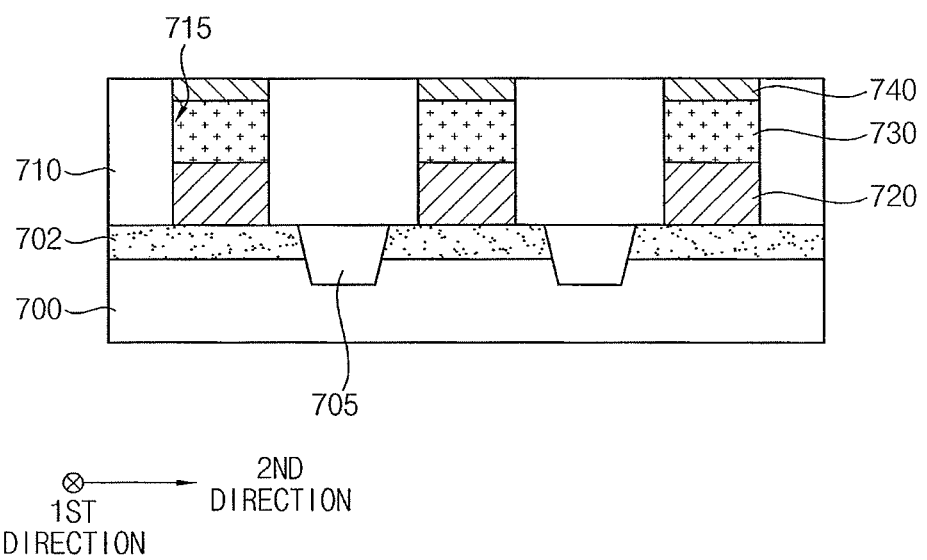

Referring to FIG. 58, a selection pattern 730 and an intermediate electrode 740 may be formed to fill a remaining portion of the first opening 715.

In example embodiments, a selection material layer may be formed of an OTS material on the lower electrode 720 to fill the first opening 715. The selection material layer may be partially removed by a CMP process and an etch back process to form the selection pattern 730 partially filling the first opening 715.

An intermediate electrode layer may be formed on the selection pattern 730 to fill the first opening 715, and may be planarized by a CMP process to form the intermediate electrode 740 covering an upper surface of the selection pattern 730.

Figure 59:
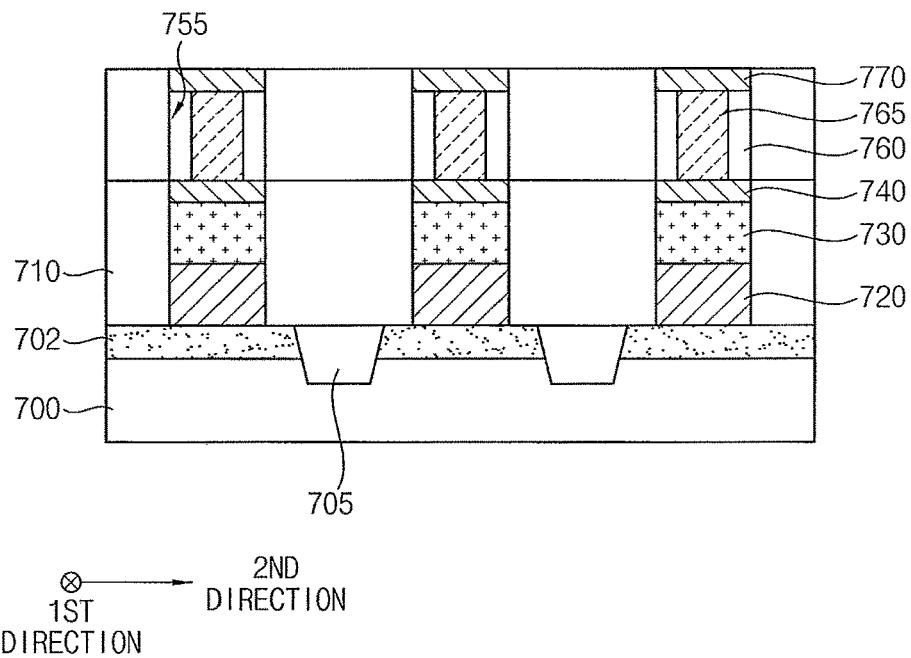

Referring to FIG. 59, a second insulating interlayer 750 may be formed on the first insulating interlayer 710 to cover the intermediate electrode 740, and may be partially removed to form a second opening 755.

In example embodiments, an upper surface of the intermediate electrode 740 may be exposed by the second opening 755. The layout of the second opening 755 may be substantially the same as or similar to that of the first opening 715.

Processes substantially the same as or similar to those illustrated with reference to FIGS. 19 to 23 may be performed.

Thus, a spacer 760 may be formed on a sidewall of the second opening 755, and a variable resistance pattern 765 may be formed. A sidewall of the variable resistance pattern 765 may be surrounded by the spacer 760. An upper electrode 770 may be formed in an upper portion of the second opening 755 to cover upper surfaces of the spacer 760 and the variable resistance pattern 765.

Figure 60:
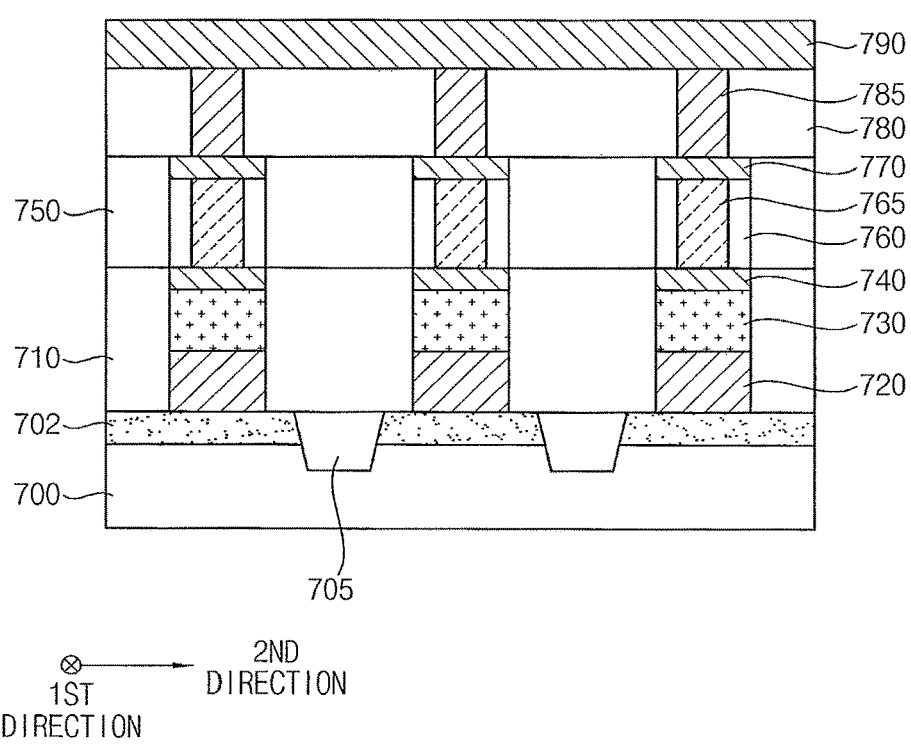

Referring to FIG. 60, a third insulating interlayer 780 may be formed on the second insulating interlayer 750 to cover the upper electrodes 770, and a conductive contact plug 785 may be formed through the third insulating interlayer 780 to contact the upper electrode 770. A second conductive line 790 may be formed on the third insulating interlayer 780 to extend in the second direction and be electrically connected to the conductive contact plugs 785.

In an example embodiment, the conductive contact plug 785 may not be formed but omitted, and the second conductive line 790 may directly contact the upper electrode 770.

In the variable resistance memory device in accordance with example embodiments, the off-current may be reduced by changing the composition of the electrode contacting the selection pattern, and the operation reliability and characteristics distribution of the memory cells may be enhanced. Accordingly, the variable resistance memory device may be effectively applied to PRAM devices, ReRAM devices, MRAM devices, etc.

The embodiments may provide a variable resistance memory device having enhanced operation reliability.

In the variable resistance memory device in accordance with example embodiments, the electrode contacting the selection pattern including a chalcogenide material may include an n-type semiconductor material or a high work function conductive material. Thus, a P-N junction or a Schottky barrier may be formed between the selection pattern and the electrode, and the off-current in the memory cells may be reduced. Accordingly, the disturbance or interference between neighboring memory cells by the off-current may be prevented or reduced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A variable resistance memory device, comprising:
   a selection pattern;
   an intermediate electrode contacting a first surface of the selection pattern;
   a variable resistance pattern on an opposite side of the intermediate electrode relative to the selection pattern; and
   a first electrode contacting a second surface of the selection pattern and including a n-type semiconductor material, the second surface of the selection pattern being opposite the first surface thereof,
   wherein the variable resistance memory device includes a P-N junction or a Schottky barrier that is formed by the first electrode together with the selection pattern at an interface between the first electrode and the selection pattern, and
   wherein the first electrode includes an n-type chalcogenide material.

2. The variable resistance memory device as claimed in claim 1, wherein the selection pattern includes an ovonic threshold switch (OTS) material.

3. The variable resistance memory device as claimed in claim 2, wherein the selection pattern includes arsenic and at least two of silicon, germanium, antimony, tellurium, selenium, indium, and tin.

4. The variable resistance memory device as claimed in claim 2, wherein the selection pattern includes selenium and at least two of arsenic, silicon, germanium, antimony, tellurium, indium, and tin.

5. The variable resistance memory device as claimed in claim 1, wherein the variable resistance pattern includes germanium-antimony-tellurium (GST), a super lattice having germanium-tellurium and antimony-tellurium, indium-antimony-tellurium (IST), or bismuth-antimony-tellurium (BST).

6. The variable resistance memory device as claimed in claim 1, wherein the intermediate electrode includes carbon or a carbonitride.

7. The variable resistance memory device as claimed in claim 1, further comprising a second electrode on an opposite side of the intermediate electrode relative to the variable resistance pattern.

8. The variable resistance memory device as claimed in claim 7, wherein the second electrode includes metallic titanium or titanium nitride.

9. The variable resistance memory device as claimed in claim 1, wherein at least one of the variable resistance pattern and the selection pattern has an area that is less than an area of the intermediate electrode in a plan view.

10. The variable resistance memory device as claimed in claim 9, further comprising a spacer covering a sidewall of at least one of the variable resistance pattern and the selection pattern.

11. The variable resistance memory device as claimed in claim 1, further comprising:
a substrate;
first conductive lines adjacent to one another along a first direction on the substrate, each of the first conductive lines extending in a second direction that crosses the first direction, and the first and second directions being parallel to an upper surface of the substrate; and
second conductive lines adjacent to one another along the second direction and over the first conductive lines, each of the second conductive lines extending in the first direction,
wherein a plurality of first memory cells are formed between the first and second conductive lines, the first memory cells being in respective overlapping areas of the first and second conductive lines in a vertical direction substantially perpendicular to the upper surface of the substrate, and each of the first memory cells including the first electrode, the selection pattern, the intermediate electrode, and the variable resistance pattern.

12. The variable resistance memory device as claimed in claim 11, further comprising third conductive lines adjacent to one another along the first direction and over the second conductive lines, each of the third conductive lines extending in the second direction,
wherein a plurality of second memory cells are formed between the second and third conductive lines, the second memory cells being in respective overlapping areas of the second and third conductive lines in the vertical direction.

13. A variable resistance memory device, comprising:
a selection pattern;
a variable resistance pattern;
an intermediate electrode between the selection pattern and the variable resistance pattern;
an outer layer on the selection pattern such that the selection pattern is between the outer layer and the intermediate electrode, the outer layer contacting a surface of the selection pattern,
wherein the variable resistance memory device includes a P-N junction that is formed by the outer layer together with the selection pattern at an interface between the outer layer and the selection pattern, and
wherein the outer layer includes an n-type chalcogenide material.

14. The variable resistance memory device as claimed in claim 13, wherein the outer layer is an electrode.

15. The variable resistance memory device as claimed in claim 13, wherein the outer layer is a barrier pattern.

16. The variable resistance memory device as claimed in claim 13, wherein the selection pattern includes an ovonic threshold switch (OTS) material.

* * * * *